US012672428B2

(12) United States Patent
Choi et al.

(10) Patent No.: US 12,672,428 B2
(45) Date of Patent: Jun. 30, 2026

(54) DISPLAY DEVICE

(71) Applicant: Samsung Display Co., Ltd., Yongin-Si (KR)

(72) Inventors: Yun Mi Choi, Yongin-si (KR); Ok Kyung Park, Hwaseong-si (KR); Young Seok Seo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1113 days.

(21) Appl. No.: 17/568,577

(22) Filed: Jan. 4, 2022

(65) Prior Publication Data

US 2022/0376017 A1 Nov. 24, 2022

(30) Foreign Application Priority Data

May 21, 2021 (KR) ........................ 10-2021-0065321

(51) Int. Cl.
| | |
|---|---|
| *H10K 59/121* | (2023.01) |
| *G09F 9/30* | (2006.01) |
| *G09G 3/00* | (2006.01) |
| *G09G 5/00* | (2006.01) |
| *H10K 59/123* | (2023.01) |
| *H10K 59/124* | (2023.01) |
| *H10K 59/131* | (2023.01) |
| *H10K 102/00* | (2023.01) |

(52) U.S. Cl.
CPC ....... *H10K 59/121* (2023.02); *H10K 59/1213* (2023.02); *H10K 59/131* (2023.02); *H10K 2102/311* (2023.02)

(58) Field of Classification Search
CPC ............. H10K 59/353; H10K 59/1213; H10K 59/121; H10K 59/123; H10K 2102/311; H10K 77/111; H10K 59/131; G09G 2300/0439; G09G 3/035; G09F 9/301
See application file for complete search history.

(56) References Cited

U.S. PATENT DOCUMENTS

| | | | |
|---|---|---|---|
| 10,468,475 B2 | 11/2019 | Cai | |
| 10,886,489 B2 | 1/2021 | Lee et al. | |
| 2016/0111479 A1* | 4/2016 | Kim ..................... | H10K 77/111 |
| | | | 257/40 |
| 2018/0151835 A1 | 5/2018 | Kim et al. | |
| 2019/0165060 A1* | 5/2019 | Choi .................... | H10K 59/122 |

FOREIGN PATENT DOCUMENTS

| | | |
|---|---|---|
| JP | 2019-102130 A | 6/2019 |
| KR | 10-2020-0030291 A | 3/2020 |
| KR | 10-2020-0066934 A | 6/2020 |
| KR | 10-2020-0131520 A | 11/2020 |

\* cited by examiner

*Primary Examiner* — Antonio B Crite
(74) *Attorney, Agent, or Firm* — Innovation Counsel LLP

(57) ABSTRACT

A display device capable of reducing stress applied to a display panel and improving the flexibility of a bendable part of the display panel is provided. According to an embodiment, a display device includes a display panel including a bending region which is partially bent, and a boundary region which is connected to the bending region, a bent location of the bending region varies so that the area of the display panel being exposed in one direction changes, the boundary region includes a plurality of pixels and a plurality of driving circuits for driving the pixels, and the bending region includes a plurality of copy pixels which are driven by the driving circuits of the boundary region.

20 Claims, 22 Drawing Sheets

PX: PX3, PX4
CPX: CPX7, CPX8, CPX9, CPX10, CPX11, CPX12
CL3: CL31, CL32, CL33
CL4: CL41, CL42, CL43

PX: PX1, PX2
CPX: CPX1, CPX2
CL1: CL11, CL12
CL2: CL21, CL22

PX: PX1, PX2
CPX: CPX1, CPX2
CL1: CL11, CL12
CL2: CL21, CL22

PX: PX1, PX2
CPX: CPX1, CPX2, CPX3, CPX4, CPX5, CPX6
CL1: CL11, CL12, CL13
CL2: CL21, CL22, CL23

PX: PX3, PX4
CPX: CPX7, CPX8, CPX9, CPX10, CPX11, CPX12
CL3: CL31, CL32, CL33
CL4: CL41, CL42, CL43

FIG. 15

PX: PX1, PX2
CPX: CPX1, CPX2
CL1: CL11, CL12
CL2: CL21, CL22

FIG. 17

PX: PX1, PX2
CPX: CPX1, CPX2
CL1: CL11, CL12
CL2: CL21, CL22

FIG. 20

DISPLAY DEVICE

CROSS-REFERENCE TO RELATED APPLICATION

This application claims priority to Korean Patent Application No. 10-2021-0065321 filed on May 21, 2021, and all the benefits accruing therefrom under 35 U.S.C. § 119, the content of which in its entirety is herein incorporated by reference.

BACKGROUND

1. Field of the Disclosure

The present disclosure relates to a display device.

2. Description of the Related Art

Display devices are becoming more important with developments in multimedia technology. Accordingly, various display devices such as a liquid crystal display (LCD) device, an organic light-emitting diode (OLED) display device, and the like have been used.

Meanwhile, mobile electronic devices include display devices for providing an image to a user. Recently, bendable, rollable, slidable, and stretchable display devices including flexible display panels that are bendable, foldable, or rollable are being developed, and it is important to reduce the stress applied to the flexible display panels in designing such flexible display devices.

SUMMARY

Embodiments of the current disclosure to provide a display device capable of reducing stress applied to a display panel and improving the flexibility of a bendable part of the display panel.

According to an embodiment of the present disclosure, a display device includes a display panel including a bending region which is partially bent, and a boundary region which is connected to the bending region, a bent location of the bending region varies so that the area of the display panel being exposed in one direction changes, the boundary region includes a plurality of pixels and a plurality of driving circuits for driving the plurality of pixels, and the bending region includes a plurality of copy pixels which are driven by the driving circuits in the boundary region.

The display device may further include a plurality of connecting lines disposed in the bending region and the boundary region, one connecting line of the plurality of connecting lines connecting one pixel among the plurality of pixels and one pixel among the plurality of is copy pixels.

The display panel may further include a substrate, one or more inorganic films which are disposed on the substrate and a plurality of cutout portions which are disposed in the bending region, the plurality of cutout portions being regions in which the one or more inorganic films are removed.

The inorganic films may include a gate insulating film which is disposed on the substrate, a first interlayer insulating film which is disposed on the gate insulating film, and a second interlayer insulating film which is disposed on the first interlayer insulating film, and the cutout portions penetrate the second interlayer insulating film.

The plurality of connecting lines may be disposed on the first interlayer insulating film.

The plurality of connecting lines may be disposed on the gate insulating film.

The plurality of connecting lines may be disposed on the second interlayer insulating film.

The plurality of pixels and the plurality of copy pixels may include a plurality of pixel electrodes, and the plurality of connecting lines may electrically connect the plurality of pixel electrodes of the plurality of pixels and the plurality of pixel electrodes of the plurality of copy pixels.

One driving circuit of the plurality of driving circuits may include a thin-film transistor, the thin-film transistor include an active layer, a gate electrode which is disposed on the active layer, a source electrode which is disposed on the gate electrode, and a drain electrode which is disposed on the gate electrode, and the connecting line is connected to the drain electrode.

A portion of the connecting line may overlap with a cutout portion of the plurality of cutout portions in a plan view, and the display panel may further include a first planarization film which is disposed on the second interlayer insulating film, and a second planarization film which is disposed on the first planarization film.

A portion of a connection line that is exposed by the cutout portion may be covered by one of the first planarization film and the second planarization film.

The planarization films cutout portions may further penetrate the first interlayer insulating film.

A cutout portion of the planarization films cutout portions may be disposed between the planarization films copy pixels in a plan view.

The cutout portion of the planarization films cutout portions may completely penetrate the display panel, and the planarization films connecting lines may be disposed to bypass the cutout portion in a plan view.

The display panel may further include a plurality of holes which are disposed between the copy pixels in a plan view and one hole of the plurality of holes may be connected to one of the plurality of cutout portions and may penetrate the display panel.

The boundary region may include a first boundary region which is connected to one side of the bending region and a second boundary region which is connected to the other side of the bending region, and the display panel may further include a main region, which is connected to the second boundary region, and an extended region, which is connected to the first boundary region and overlaps with the main region in a plan view.

The bending region may include a first bending region and a second bending region, is which is spaced apart from the first bending region.

According to an embodiment of the present disclosure, a display device includes a display panel including a main region, an extended region, which overlaps with the main region in a plan view, a bending region which is disposed between the main region and the extended region, a first boundary region which is disposed between the bending region and the extended region, and a second boundary region which is disposed between the bending region and the main region. Each of the first boundary region and the second boundary region includes a plurality of pixels and a plurality of driving circuits for driving the plurality of pixels. The bending region includes a plurality of copy pixels which are connected to either the plurality of driving circuits in the first boundary region or the driving circuits in the second boundary region.

The display device may further includes a plurality of connecting lines disposed in the bending region and the first boundary region, the plurality of connecting lines connecting the plurality of pixels and the plurality of copy pixels.

The display panel may further include a substrate, one or more inorganic films which are disposed on the substrate, and a plurality of cutout portions which are disposed in the bending region and penetrate the one or more inorganic films.

According to an embodiment of the disclosure, stress applied to a display panel can be reduced, and the flexibility of a wound part of a display panel can be improved.

It should be noted that effects of the present disclosure are not limited to those described above and other effects of the present disclosure will be apparent to those skilled in the art from the following descriptions.

BRIEF DESCRIPTION OF THE DRAWINGS

The above and other features of the inventive concept will become more apparent by describing in detail embodiments thereof with reference to the accompanying drawings, in which:

FIG. 15 is a cross-sectional view, taken along line D-D' of FIG. 13, of the display panel of FIG. 13;

FIG. 17 is a cross-sectional view, taken along line D-D' of FIG. 13, of a display panel according to another embodiment of the present disclosure;

FIG. 20 is a cross-sectional view, taken along line E-E' of FIG. 13, of the display panel of FIG. 19;

4

Figure 21:
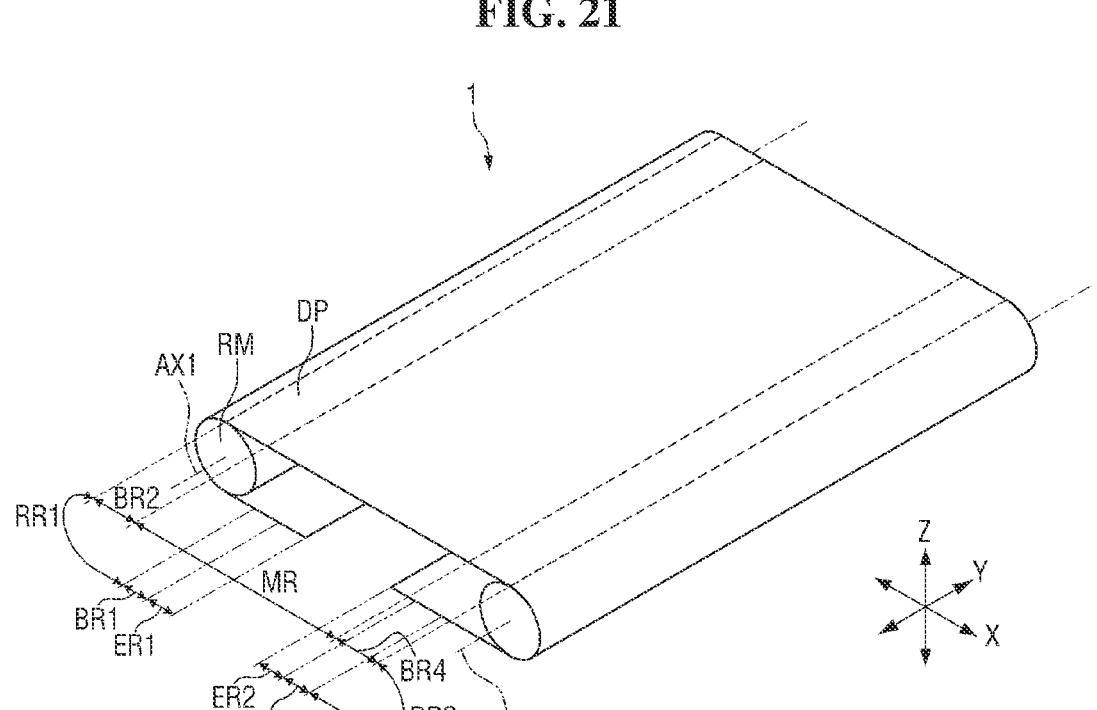
Figure 22:
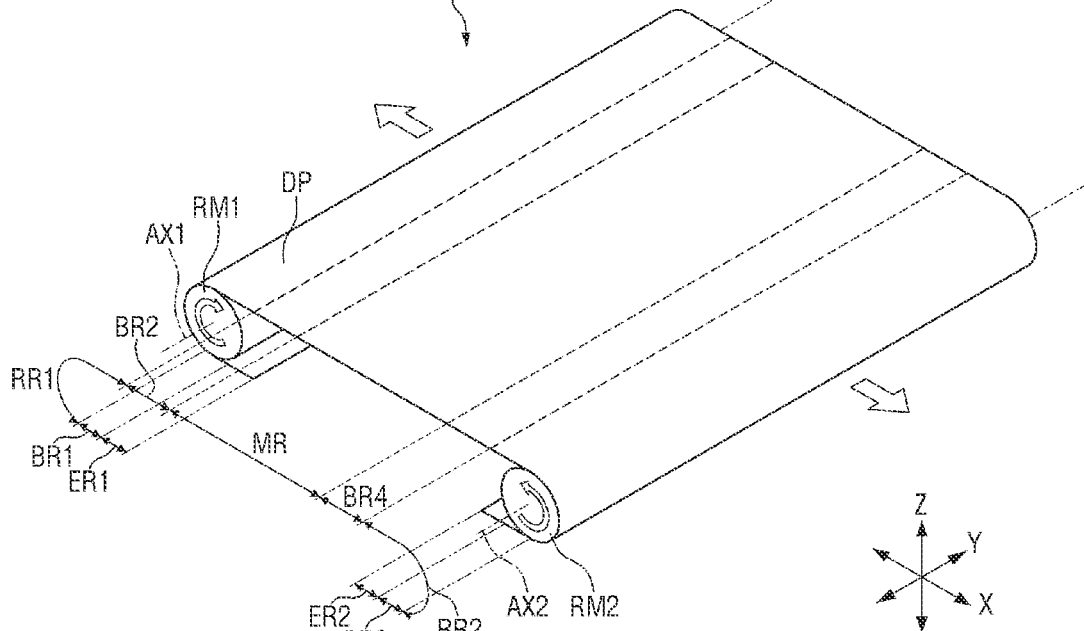

FIG. 21 is a perspective view of a display device according to another embodiment of the present disclosure; and FIG. 22 is a perspective view of the display device of FIG. 21 when a display panel is not unrolled.

DETAILED DESCRIPTION OF THE EMBODIMENTS

The inventive concept now will be described more fully hereinafter with reference to the accompanying drawings, in which various embodiments are shown. This inventive concept may, however, be embodied in many different forms, and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly is indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used is herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the inventive concept present disclosure will be described in detail with reference to the accompanying drawings.

Figure 1:
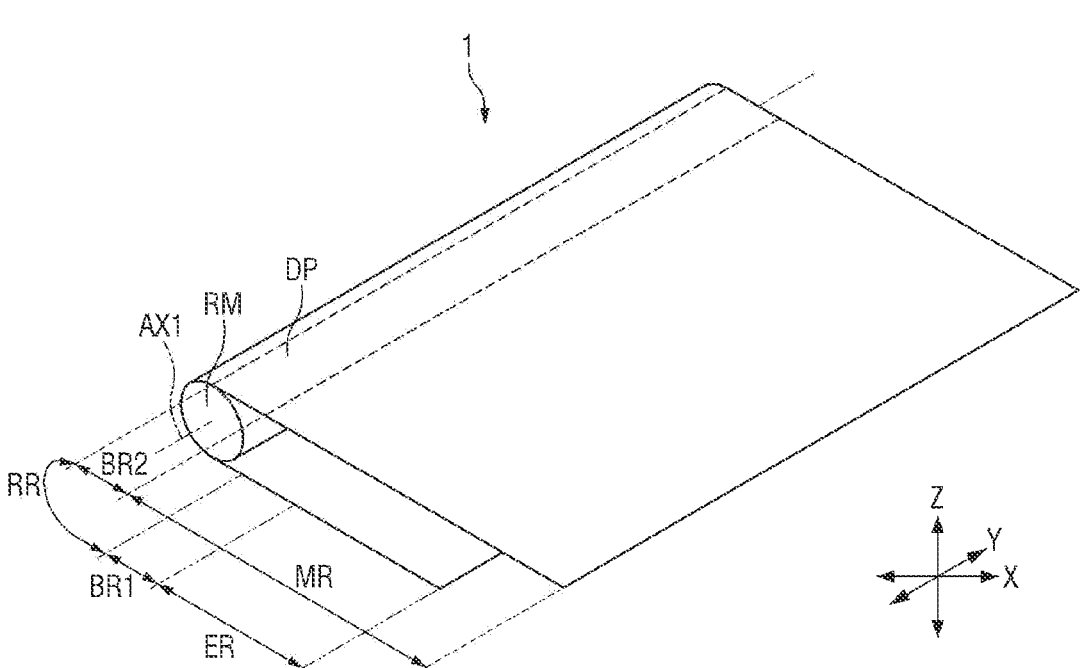
FIG. 1 is a perspective view of a display device according to an embodiment of the present disclosure.
Figure 2:
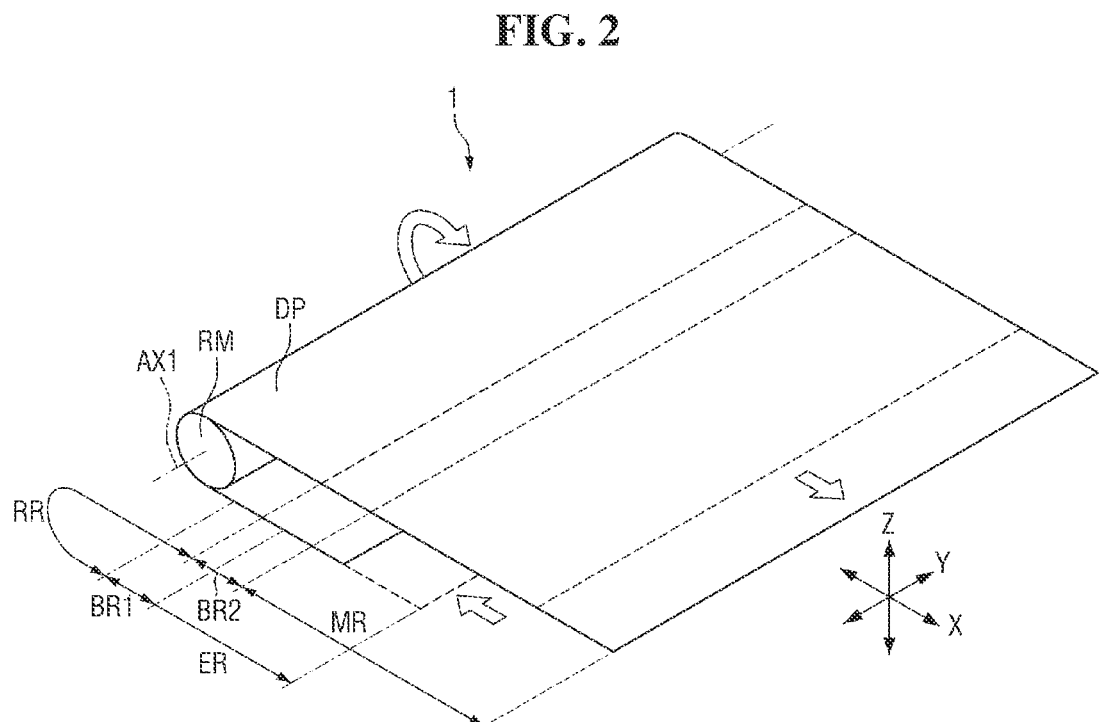
FIG. 2 is a perspective view of the display device of FIG. 1 when a display panel is not unrolled.

FIG. 1 is a perspective view of a display device according to an embodiment of the present disclosure. FIG. 2 is a perspective view of the display device of FIG. 1 when the display device is not unrolled.

In the description that follows, first, second, and third directions X, Y, and Z refer to different directions that intersect one another. For example, the first direction X may be a lengthwise direction, the second direction Y may be a widthwise direction, and the third is direction Z may be a thickness direction. Each of the first, second, and third directions X, Y, and Z may include two or more directions. For example, the third direction Z may include upward and downward directions. In this example, a surface of an element that faces upward may be referred to as a top surface, and a surface of the element that faces downward may be referred to as a bottom surface. The upward and downward directions may also be referred to as front- and back-side directions, respectively. These directions, however, are not particularly limited but should be understood as being relative to one another.

Examples of a display device 1 include various devices capable of displaying a screen or an image. Examples of the display device 1 include, but are not limited to, a smartphone, a mobile phone, a tablet personal computer (PC), a personal digital assistant (PDA), a portable multimedia player (PMP), a television (TV), a gaming console, a wristwatch-type electronic device, a head-mounted display (HMD), a PC monitor, a laptop computer, a car navigation, a car dashboard, a digital camera, a camcorder, an external billboard, an electronic billboard, a medical device, an inspection device, a household appliance with a display area (e.g., a refrigerator or a washing machine), an Internet of Things (IoT) device, and the like.

Referring to FIG. 1, the display device 1 may include a display panel DP and a driver RM.

The display panel DP may be a light-emitting display panel DP including light-emitting elements. For example, the display panel DP may be an organic light-emitting diode (OLED) display panel using OLEDs, which include organic light-emitting layers, a micro-light-emitting diode (microLED) display panel using microLEDs, a quantum-dot light-emitting diode (QLED) display panel using QLEDs, which include quantum-dot light-emitting layers, or an inorganic light-emitting display panel using inorganic light-emitting elements, which include an is inorganic semiconductor. The display panel DP will hereinafter be described as being, for example, an OLED display panel.

A surface of the display panel DP that displays an image may be exposed to the outside, and the other surface of the display panel DP may face, and be wound around, the driver RM. Accordingly, the display device 1 can display an image in the upward direction, the downward direction, or a lateral direction (e.g., a leftward direction).

The driver RM may provide a first rotation axis AX1. The first rotation axis AX1 may extend in the second direction Y. The driver RM may be rotatable about the first rotation axis AX1 so that the display panel DP may be moved in a direction that intersects the first rotation axis AX1. The driver RM may include at least one element for controlling the shape of the display panel DP. For example, the driver RM may include a cylinder which is connected to a driving motor that rotates the cylinder, but the present disclosure is not limited thereto.

The display panel DP may include a main region MR, a bending region RR, an extended region ER, a first boundary region BR1, and a second boundary region BR2.

The main region MR may be a region that is disposed at the front side of the display device 1 and is mainly visible to a user. The main region MR may be a region that is exposed to the outside when the display panel DP is not unrolled. The main region MR may display an image in the third direction Z, for example, in the upward direction (or in the front-side direction).

The bending region RR may connect the main region MR and the extended region ER. A part of the bending region RR may be bent to surround the first rotation axis AX1. For example, the part of the bending region RR may be wound around the first rotation axis AX1 of the driving member RM which has a round outer circumferential surface. The part of the is bending region RR may display an image in the first direction X, for example, in the leftward direction. The first direction X may also be referred to as a lateral direction. When the display panel DP is not unrolled, another part of the bending region RR may display an image in the downward direction. As will be described later, a plurality of copy pixels CPX may be disposed in the bending region RR so that the bending region RR may have a lower resolution than the main region MR, the extended region ER, the first boundary region BR1, or the second boundary region BR2, but the present disclosure is not limited thereto.

The bending region RR may include a bent portion and a bendable portion. The bent portion is moved in the first direction X according to rolling the display panel PD by the driver RM. The bent portion, for example, may refer to a portion of the bending region RR that is bent to surround the first rotation axis AX1. the bendable portion may refer to the rest of the bending region RR except the bent portion. However, the present disclosure is not limited to this.

The extended region ER may be connected to the bending region RR. The extended region ER may extend parallel to the main region MR with the driver RM interposed therebetween. The extended region ER may display an image in a direction opposite to the direction in which the main region MR displays an image, for example, in the downward direction.

The first boundary region BR1 may be disposed between the bending region RR and the extended region ER. The first boundary region BR1 may connect the bending region RR and the extended region ER. The first boundary region BR1 may display an image in the direction opposite to the direction in which the main region MR displays an image, for example, in the downward direction.

The second boundary region BR2 may be disposed between the main region and the bending region RR. The second boundary region BR2 may connect the main region MR and the bending region RR. The second boundary region BR2 may display an image in the third direction Z, for example, in the upward direction.

Referring to FIGS. 1 and 2, when the driver RM rotates in a first rotation direction, the main region MR may move in a first moving direction, and the extension region ER may move in a second moving direction which is opposite to the first moving direction. The first moving direction may be a direction away from the driver RM, and the second moving direction may be a direction toward the driver RM. For example, referring to FIG. 2, the first rotation direction may be a clockwise direction, the first moving direction may be a rightward direction and the second moving direction may be the leftward direction. However, the present disclosure is not limited to this example.

As the driver RM rotates to move the display panel DP, the location of the bending region RR that is wound around the driver RM may change. For example, in a case when the driver RM rotates in the first rotation direction, the location of the bending region RR that is wound around the driver RM may change from an area near the second boundary region BR2 to an area near the first boundary region BR1. In this case, part of the bending region RR near the main region MR and the second boundary region BR2 may be unwound from the driver RM to extend flat and parallel to the main region MR, and part of the bending region RR near the extended region ER and the first boundary region BR1 may be wound around the driver RM. As a result, an area of the display panel DP that is exposed to the outside to display an image may increase.

On the contrary, in a case where the driver RM rotates in the second rotation is direction opposite to the first rotation direction, the main region MR may move in the second moving direction, and the extended region ER may move in the first moving direction. In this case, the part of the bending region RR near the main region MR may be wound back around the driver RM, and the part of the bending region RR near the extended region ER may be unwound from the driver RM and may extend flat and parallel to the extended region ER. As a result, the size of the display panel DP that is exposed to outside to display an image, for example, in the upward direction, may decrease.

Referring to FIGS. 1 and 2, the first and second boundary regions BR1 and BR2 may extend flat and parallel to the first and second directions X and Y, but the present disclosure is not limited thereto. At least part of the first or second boundary region BR1 or BR2 may be bent over the driver RM.

Figure 3:
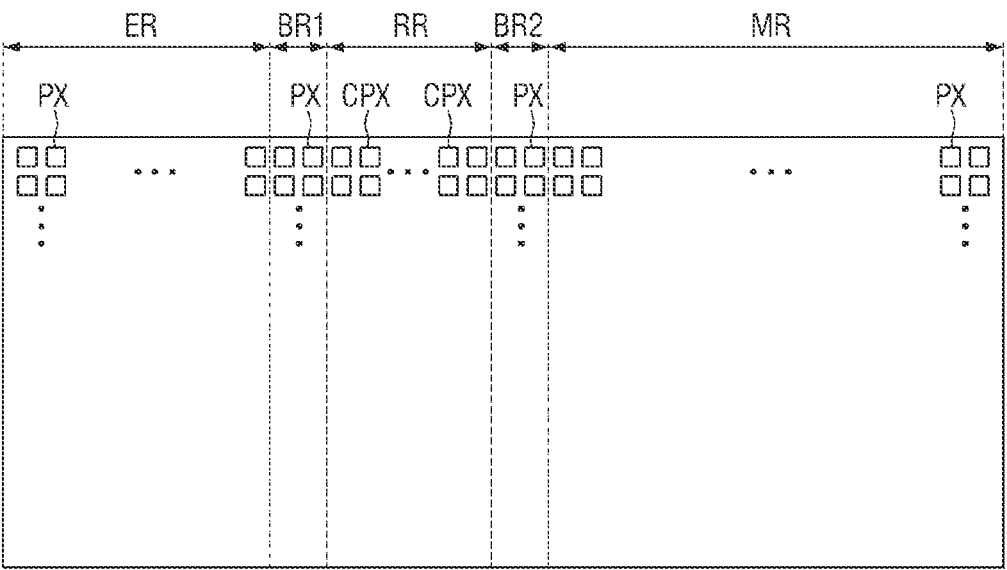
FIG. 3 is a plan view of a display panel according to an embodiment of the present disclosure.
Figure 4:
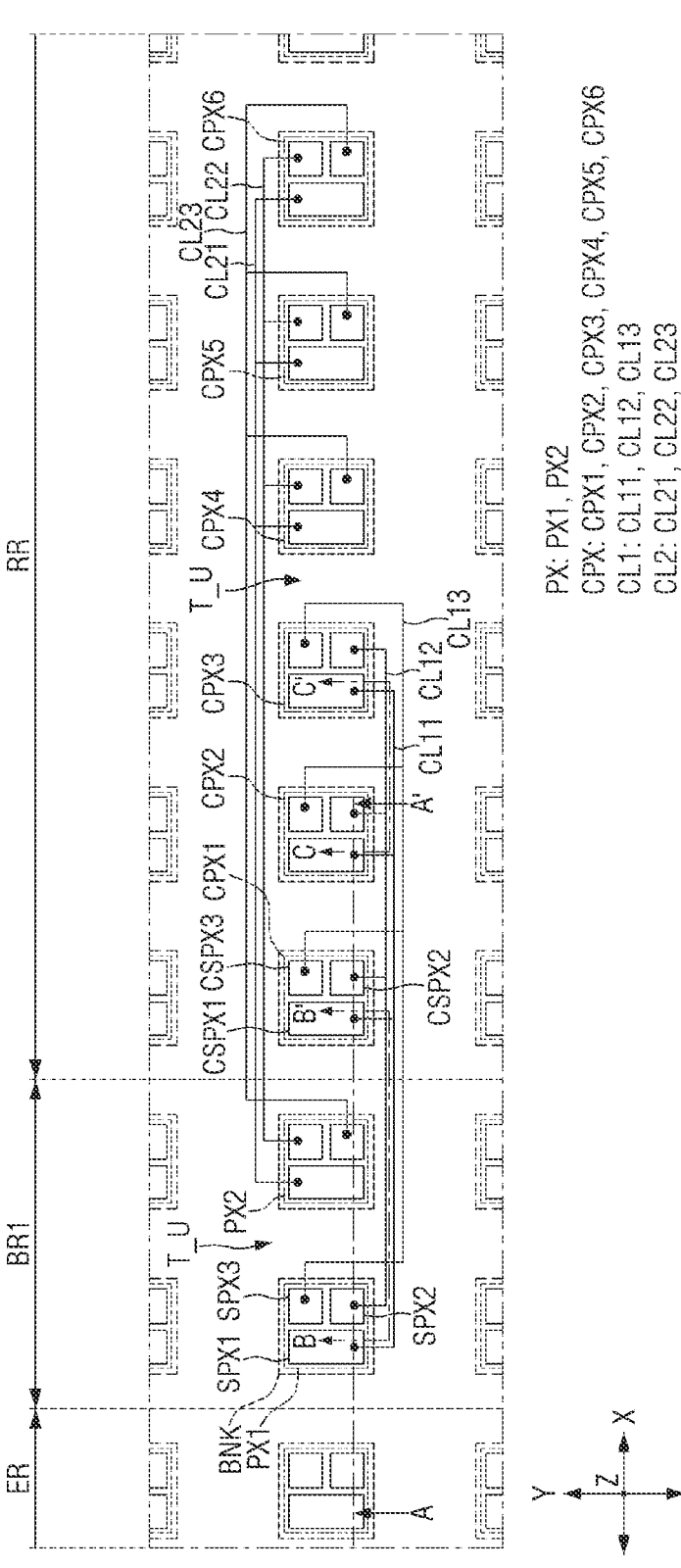
FIG. 4 is an enlarged plan view of a first boundary region and its surroundings of the display panel of FIG. 3.
Figure 5:
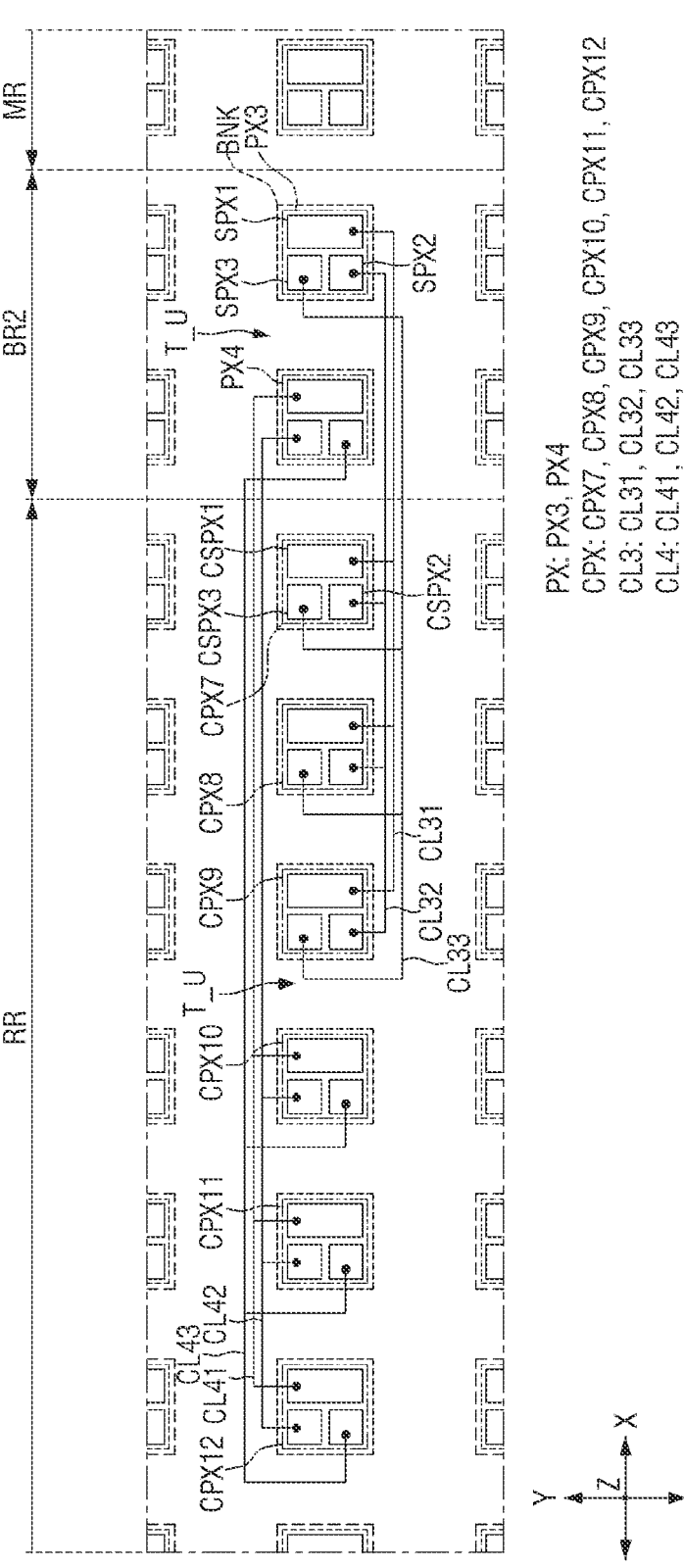
FIG. 5 is an enlarged plan view of a second boundary region and its surroundings of the display panel of FIG. 3.

FIG. 3 is a plan view of a display panel according to an embodiment of the present disclosure. FIG. 4 is an enlarged plan view of a first boundary region and its surroundings of the display panel of FIG. 3. FIG. 5 is an enlarged plan view of a second boundary region and its surroundings of the display panel of FIG. 3.

Referring to FIGS. 1 through 3, the display panel DP may generally have a rectangular shape in a plan view.

The extended region ER, the first boundary region BR1, the bending region RR, the second boundary region BR2, and the main region MR may be sequentially arranged in the first direction X. In a plan view, the extended region ER may have a larger size than the first boundary region BR1, the second boundary region BR2, and the bending region RR, and the main region MR may have a larger size than the extended region ER. The first and second boundary regions BR1 and BR2 may have the same size. In a plan view, the extended region ER, the first boundary region BR1, the bending region RR, the second boundary region BR2, and the main region MR may have the same length in the second direction Y and have different lengths in the first direction X, but the present disclosure is not limited thereto. The sizes or the lengths of the extended region ER, the first boundary region BR1, the bending region RR, the second boundary region BR2, and the main region MR may vary depending on the design of the display device 1.

A plurality of pixels PX may be disposed in the extended region ER, the first boundary region BR1, the second boundary region BR2, and the main region MR. A plurality of copy pixels CPX may be disposed in the bending region RR. Referring to FIG. 3, the pixels PX and the copy pixels CPX may be arranged in a matrix configuration having multiple rows in the first direction X and multiple columns in the second direction Y, but the present disclosure is not limited thereto. Alternatively, the pixels PX and the copy pixels CPX may be arranged in a matrix having multiple rows or multiple columns that extend in a diagonal direction.

Each of the pixels PX may include a plurality of subpixels (SPX1, SPX2, and SPX3). Each of the copy pixels CPX may include a plurality of sub-copy pixels (CSPX1, CSPX2, and CSPX3). Each of the pixels PX may include three subpixels, and each of the copy pixels CPX may include three sub-copy pixels. However, the number of subpixels disposed in each of the pixels PX and the number of sub-copy pixels disposed in each of the copy pixels CPX are not particularly limited.

The subpixels (SPX1, SPX2, and SPX3) may include first, second, and third subpixels SPX1, SPX2, and SPX3. The sub-copy pixels (CSPX1, CSPX2, and CSPX3) may include first, second, and third sub-copy pixels CSPX1, CSPX2, and CSPX3. For example, the first subpixel SPX1 and the first sub-copy pixel CSPX1 may emit blue light, the second subpixel SPX2 and the second sub-copy pixel CSPX2 may emit green light, and the third subpixel SPX3 and the third sub-copy pixel CSPX3 may emit red light. However, the present disclosure is not limited to this example.

Referring to FIGS. 1 through 5, the display device 1 may include a plurality of connecting lines (CL1, CL2, CL3, and CL4) which connect the pixels PX and the copy pixels CPS. As will be described later, the copy pixels CPX may be connected to the connecting lines (CL1, CL2, CL3, and CL4) such that the same anode voltage as that applied to pixels PX in the first or second boundary region BR1 or BR2 may be applied to the copy pixels CPX. The anode voltage may be a voltage applied to pixel electrodes 171 of FIG. 6 that will be described later. Accordingly, pixel circuitry and signal lines for driving the copy pixels CPX may not be provided in the bending region RR.

Each of the first and second boundary regions BR1 and BR2 is illustrated in FIGS. 4 and 5 as including two columns of pixels PX, but the number of columns of pixels PX included in each of the first or second boundary region BR1 or BR2 is not particularly limited.

For convenience, a pixel PX disposed in the first boundary region BR1and spaced apart from the bending region RR will hereinafter be referred to as a first pixel PX1, a pixel PX disposed in the first boundary region BR1 closer than the first pixel PX1 to the bending region RR will hereinafter be referred to as a second pixel PX2, a copy pixel CPX disposed closest to the first boundary region BR1 will hereinafter be referred to as a first copy pixel CPX1, and copy pixels CPX sequentially arranged next to the first copy pixel CPX1 will hereinafter be referred to as second, third, fourth, fifth, and sixth copy pixels CPX2, CPX3, CPX4, CPXS, and CPX6. Also, a pixel PX disposed in the second boundary region BR2 and spaced apart from the bending region RR will hereinafter be referred to as a third pixel PX3, a pixel PX disposed in the second boundary region BR2 closer than the third pixel PX3 to the bending region RR will hereinafter be referred to as a fourth pixel PX4, a copy pixel CPX disposed closest to the second boundary region BR2 will hereinafter be referred to as a seventh copy pixel CPX7, and copy pixels CPX sequentially arranged next to the seventh copy pixel CPX7 will hereinafter be referred to as eighth, ninth, tenth, eleventh, and twelfth copy pixels CPX8, CPX9, CPX10, CPX11, and CPX12.

As illustrated in FIG. 4, the connecting lines (CL1, CL2, CL3, and CL4) may include first and second connecting lines CL1 and CL2 which connect the pixels PX in the first boundary region BR1 to the copy pixels CPX in the bending region RR.

The first and second connecting lines CL1 and CL2 may extend from the first boundary region BR1 to the bending region RR. The first connecting line CL1 may be connected to the first pixel PX1 and at least one copy pixel CPX, but the present disclosure is not limited thereto. The second connecting line CL2 may be connected to the second pixel PX2 and at least one copy pixel CPX, but the present disclosure is not limited thereto. Alternatively, the first connecting line CL1 may be connected to the second pixel PX2, and the second connecting line CL2 may be connected to the first pixel PX1.

The first connecting line CL1 may connect the first pixel PX1 to the first copy pixel CPX1. The first connecting line CL1 may further connect the first pixel PX1 to the second and third copy pixels CPX2 and CPX3. The second connecting line CL2 may connect the second pixel PX2 to the fourth copy pixel CPX4. The second connecting line CL2 may further connect the second pixel PX2 to the fifth and sixth copy pixels CPX5 and CPX6.

The first and second connecting lines CL1 and CL2 may be disposed between the pixels PX and between the copy pixels CPX. Parts of the first connecting line CL1 that are is connected to the pixels PX or the copy pixels CPX and parts of the second connecting line CL2 that are connected to the pixels PX or the copy pixels CPX may overlap with the pixels PX or the copy pixels CPX.

Each of the first and second connecting lines CL1 and CL2 may include a plurality of sub-connecting lines which connect a plurality of subpixels (SPX1, SPX2, and SPX3) and a plurality of sub-copy pixels (CSPX1, CSPX2, and CSPX3).

The first connecting line CL1 may include (1-1)-th, (1-2)-th, and (1-3)-th connecting lines CL11, CL12, and CL13.

The (1-1)-th connecting line CL11 may connect a first subpixel SPX1 of the first pixel PX1 to a first sub-copy pixel CSPX1 of the first copy pixel CPX1, a first sub-copy pixel CSPX1 of the second copy pixel CPX2, and a first sub-copy pixel CSPX1 of the third copy pixel CPX3. The (1-2)-th connecting line CL12 may connect a second subpixel SPX2 of the first pixel PX1 to a second sub-copy pixel CSPX2 of the first copy pixel CPX1, a second sub-copy pixel CSPX2 of the second copy pixel CPX2, and a second sub-copy pixel CSPX2 of the third copy pixel CPX3. The (1-3)-th connecting line CL13 may connect a third subpixel SPX3 of the first pixel PX1 to a third sub-copy pixel CSPX3 of the first copy pixel CPX1, a third sub-copy pixel CSPX3 of the second copy pixel CPX2, and a third sub-copy pixel CSPX3 of the third copy pixel CPX3.

The second connecting line CL2 may include (2-1)-th, (2-2)-th, and (2-3)-th connecting lines CL21, CL22, and CL23.

The (2-1)-th connecting line CL21 may connect a first subpixel SPX1 of the second pixel PX2 to a first sub-copy pixel CSPX1 of the fourth copy pixel CPX4, a first sub-copy pixel CSPX1 of the fifth copy pixel CPX5, and a first sub-copy pixel CSPX1 of the sixth copy pixel CPX6. The (2-2)-th connecting line CL22 may connect a second subpixel SPX2 of the second pixel PX2 to a second sub-copy pixel CSPX2 of the fourth copy pixel CPX4, a second sub-copy pixel CSPX2 of the fifth copy pixel CPX5, and a second sub-copy pixel CSPX2 of the sixth copy pixel CPX6. The (2-3)-th connecting line CL23 may connect a third subpixel SPX3 of the second pixel PX2 to a third sub-copy pixel CSPX3 of the fourth copy pixel CPX4, a third sub-copy pixel CSPX3 of the fifth copy pixel CPX5, and a third sub-copy pixel CSPX3 of the sixth copy pixel CPX6.

As illustrated in FIG. 5, the connecting lines (CL1, CL2, CL3, and CL4) may further include third and fourth connecting lines CL3 and CL4 which connect the pixels PX in the second boundary region BR2 to the copy pixels CPX in the bending region RR.

The third and fourth connecting lines CL3 and CL4 may extend from the second boundary region BR2 to the bending region RR. The third connecting line CL3 may be connected to the third pixel PX3 and at least one copy pixel CPX, but the present disclosure is not limited thereto. The fourth connecting line CL4 may be connected to the fourth pixel PX4 and at least one copy pixel CPX, but the present disclosure is not limited thereto. Alternatively, the third connecting line CL3 may be connected to the fourth pixel PX4, and the fourth connecting line CL4 may be connected to the third pixel PX3.

The third connecting line CL3 may connect the third pixel PX3 to the seventh copy pixel CPX7. The third connecting line CL3 may further connect the third pixel PX3 to the eighth and ninth copy pixels CPX8 and CPX9. The fourth connecting line CL4 may connect the fourth pixel PX4 to the tenth copy pixel CPX10. The fourth connecting line CL4 may further connect the fourth pixel PX4 to the eleventh and twelfth copy pixels CPX11 and CPX12.

The third and fourth connecting lines CL3 and CL4 may be disposed between the is pixels PX and between the copy pixels CPX. Parts of the third connecting line CL3 that are connected to the pixels PX or the copy pixels CPX and parts of the fourth connecting line CL4 that are connected to the pixels PX or the copy pixels CPX may overlap with the pixels PX or the copy pixels CPX.

Each of the third and fourth connecting lines CL3 and CL4 may include a plurality of sub-connecting lines which connect a plurality of subpixels (SPX1, SPX2, and SPX3) and a plurality of sub-copy pixels (CSPX1, CSPX2, and CSPX3).

The third connecting line CL3 may include (3-1)-th, (3-2)-th, and (3-3)-th connecting lines CL31, CL32, and CL33.

The (3-1)-th connecting line CL31 may connect a first subpixel SPX1 of the third pixel PX3 to a first sub-copy pixel CSPX1 of the seventh copy pixel CPX7, a first sub-copy pixel CSPX1 of the eighth copy pixel CPX8, and a first sub-copy pixel CSPX1 of the ninth copy pixel CPX9. The (3-2)-th connecting line CL32 may connect a second subpixel SPX2 of the third pixel PX3 to a second sub-copy pixel CSPX2 of the seventh copy pixel CPX7, a second sub-copy pixel CSPX2 of the eighth copy pixel CPX8, and a second sub-copy pixel CSPX2 of the ninth copy pixel CPX9. The (3-3)-th connecting line CL33 may connect a third subpixel SPX3 of the third pixel PX3 to a third sub-copy pixel CSPX3 of the seventh copy pixel CPX7, a third sub-copy pixel CSPX3 of the eighth copy pixel CPX8, and a third sub-copy pixel CSPX3 of the ninth copy pixel CPX9.

The fourth connecting line CL4 may include (4-1)-th, (4-2)-th, and (4-3)-th connecting lines CL41, CL42, and CL43.

The (4-1)-th connecting line CL41 may connect a first subpixel SPX1 of the fourth pixel PX4 to a first sub-copy pixel CSPX1 of the tenth copy pixel CPX10, a first sub-copy pixel CSPX1 of the eleventh copy pixel CPX11, and a first sub-copy pixel CSPX1 of the twelfth copy pixel CPX12. The (4-2)-th connecting line CL42 may connect a second subpixel SPX2 of the fourth pixel PX4 to a second sub-copy pixel CSPX2 of the tenth copy pixel CPX10, a second sub-copy pixel CSPX2 of the eleventh copy pixel CPX11, and a second sub-copy pixel CSPX2 of the twelfth copy pixel CPX12. The (4-3)-th connecting line CL43 may connect a third subpixel SPX3 of the third pixel PX3 to a third sub-copy pixel CSPX3 of the tenth copy pixel CPX10, a third sub-copy pixel CSPX3 of the eleventh copy pixel CPX11, and a third sub-copy pixel CSPX3 of the twelfth copy pixel CPX12.

Referring to FIGS. 4 and 5, each of the first, second, third, and fourth connecting lines CL1, CL2, CL3, and CL4 may be connected to one pixel PX and three copy pixels CPX, but the present disclosure is not limited thereto. Alternatively, each of the first, second, third, and fourth connecting lines CL1, CL2, CL3, and CL4 may be connected to two or more pixels PX and two or less or four or more copy pixels CPX.

The second boundary region BR2 and part of the bending region RR near the second boundary region BR2 may have substantially the same configuration as the first boundary region BR1 and part of the bending region RR near the first boundary region BR1, and thus, only the configurations of the first boundary region BR1 and the part of the bending region RR near the first boundary region BR1 will hereinafter be described.

Figure 6:
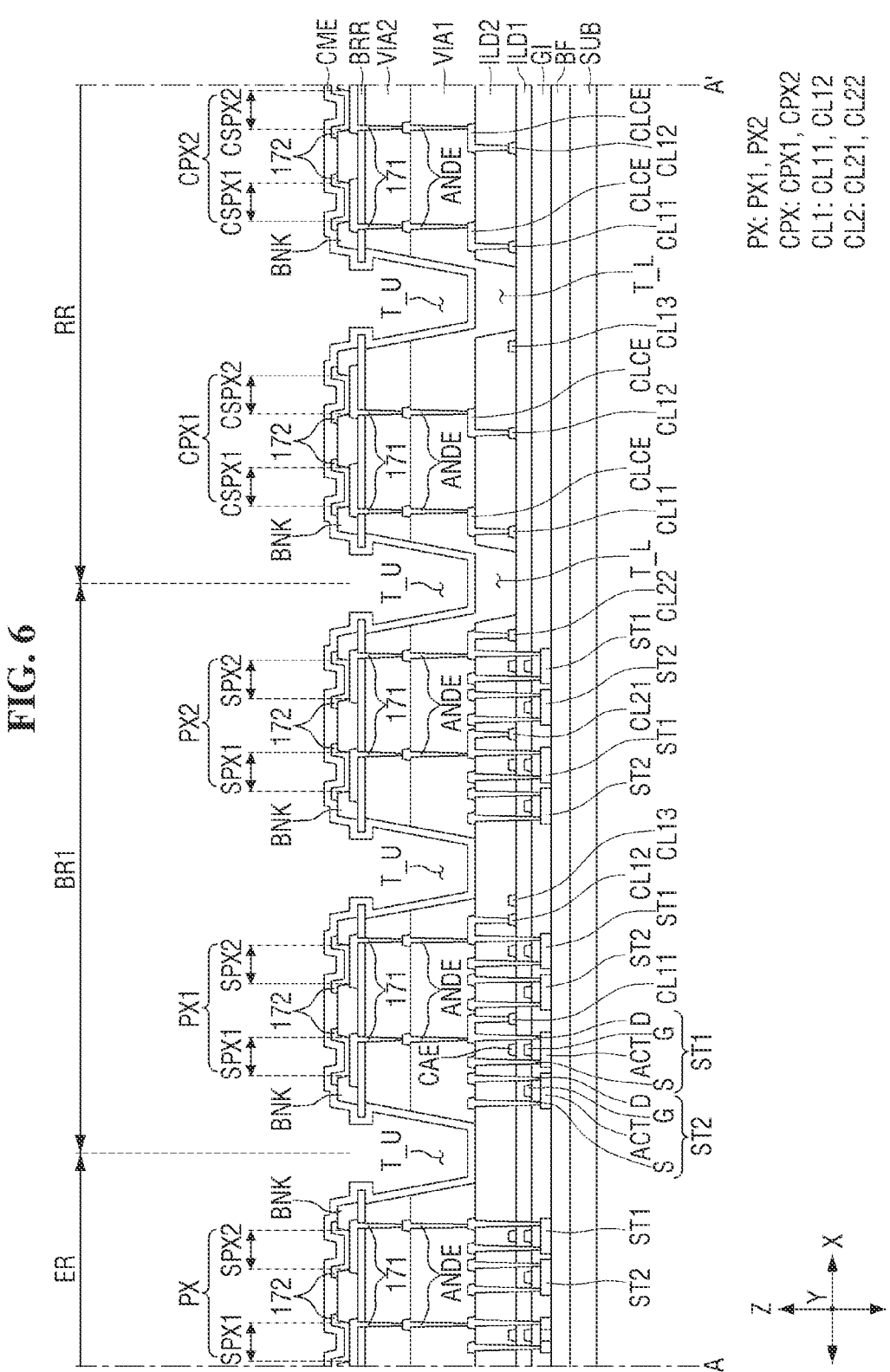
FIG. 6 is a cross-sectional view, taken along line A-A' of FIG. 4, of the display panel of FIG. 3.
Figure 7:
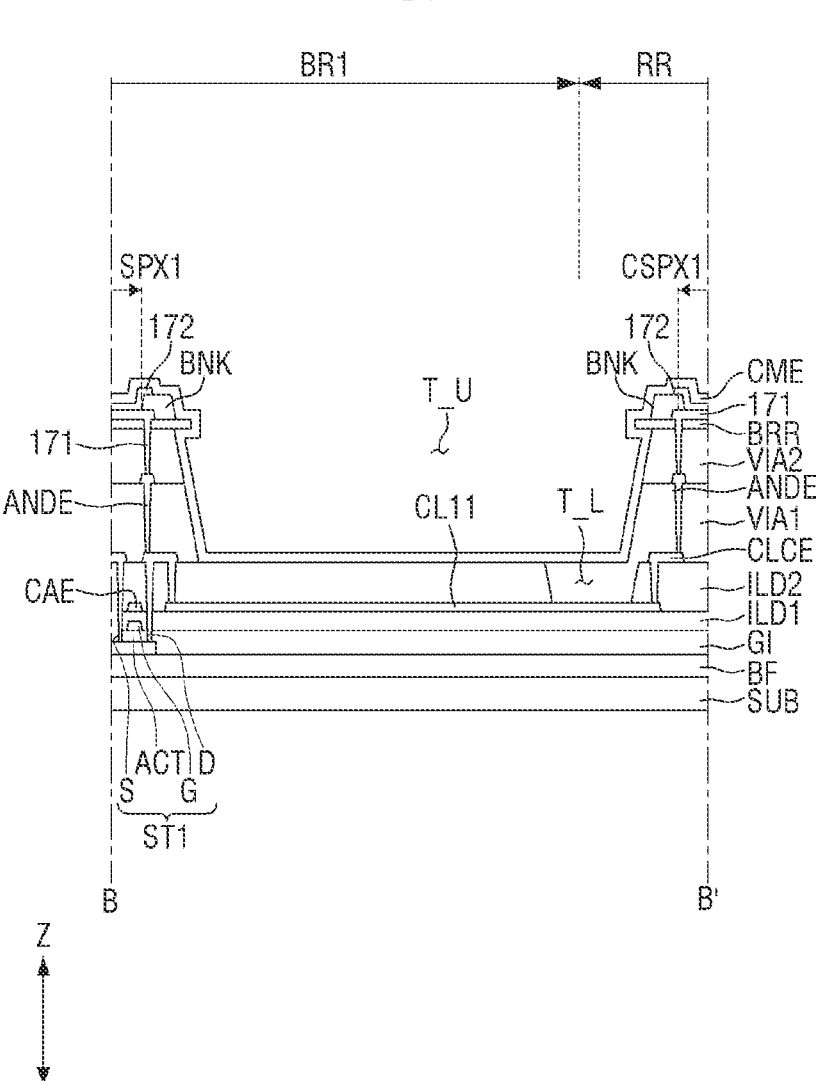
FIG. 7 is a cross-sectional view, taken along line B-B' of FIG. 4, of the display panel of FIG. 3.
Figure 8:
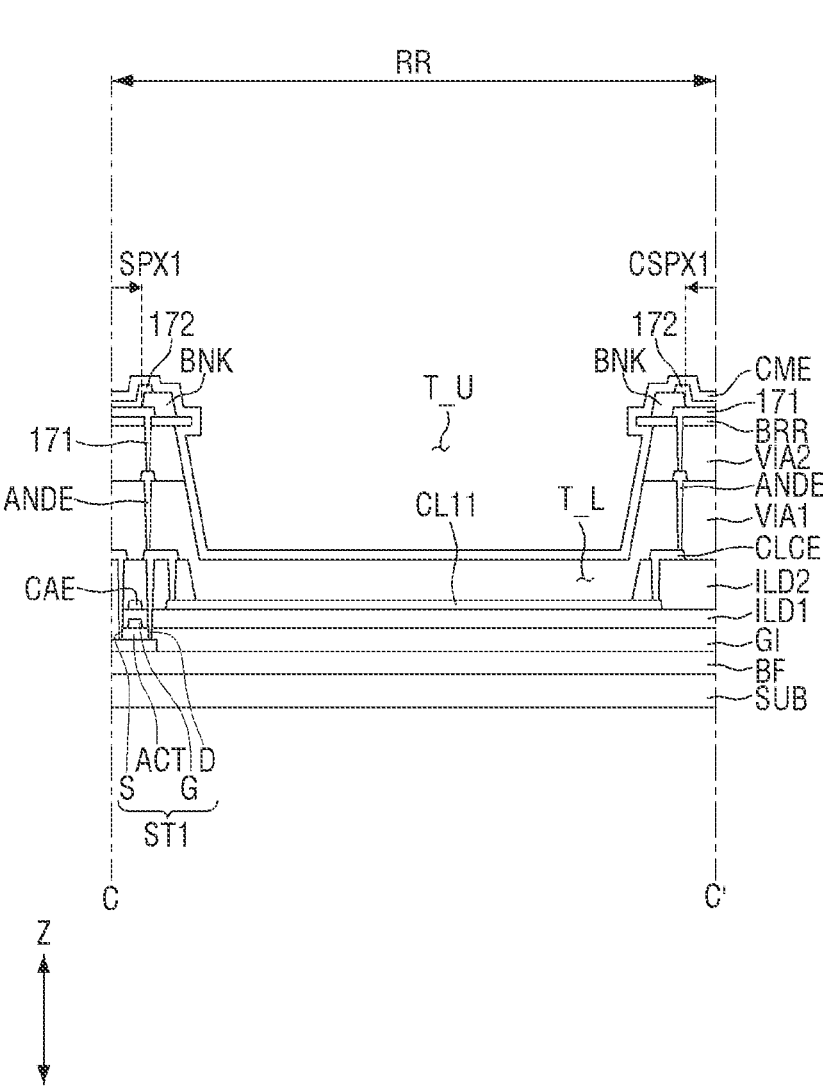
FIG. 8 is a cross-sectional view, taken along line C-C' of FIG. 4, of the display panel of FIG. 3.

FIG. 6 is a cross-sectional view, taken along line A-A' of FIG. 4, of the display panel of FIG. 3. FIG. 7 is a cross-sectional view, taken along line B-B' of FIG. 4, of the display panel of FIG. 3. FIG. 8 is a cross-sectional view, taken along line C-C' of FIG. 4, of the display panel of FIG. 3.

Referring to FIG. 6, the display panel DP may include a substrate SUB, a buffer film BF, active layers ACT, a gate insulating film GI, gate electrodes G, a first interlayer insulating film ILD1, source electrodes S, drain electrodes D, a second interlayer insulating film ILD2, a first planarization film VIA1, pixel connecting electrodes ANDE, wire connecting electrodes CLCE, a second planarization film VIA2, barrier films BRR, a bank BNK, pixel electrodes 171, light-emitting layers 172, and a common electrode CME.

The substrate SUB may be formed of an insulating material such as a polymer resin or glass. For example, the substrate SUB may include polyimide. In this example, the substrate SUB may be a flexible substrate that is bendable, foldable, or rollable.

The buffer film BF may be disposed on the substrate SUB. The buffer film BF may be formed as a silicon nitride layer, a silicon oxynitride layer, a silicon oxide layer, a titanium oxide layer, or an aluminum oxide layer.

First thin-film transistors (TFTs) ST1 and second TFTs ST2 may be disposed on the buffer film BF. Each of the first TFTs ST1 and the second TFTs ST2 may include an active layer ACT, a gate electrode G, a source electrode S, and a drain electrode D.

A pair of first and second TFTs ST1 and ST2 may be disposed in each of the subpixels of each of the pixels PX. The first TFTs ST1 and the second TFTs ST2 may not be disposed in the copy pixels CPX. That is, the first TFTs ST1 and the second TFTs ST2 may be disposed in the first boundary region BR1, the second boundary region BR2, and the extended region ER, but not in the bending region RR.

The first TFTs ST1 and the second TFTs ST2 may form driving circuits for driving the pixels PX and the copy pixels CPX. The driving circuits which include the first TFTs ST1 and the second TFTs ST2 may not be disposed in the bending region RR. Accordingly, the copy pixels CPX which are disposed in the bending region RR may be driven by driving circuits is in the first or second boundary region BR1 or BR2.

For example, the first TFTs ST1 may be driving transistors that control a drain-source current flowing between the source electrodes S and the drain electrodes D in accordance with data voltages applied to the gate electrodes G, the source electrodes S, and the drain electrodes D, and the second TFTs ST2 may be switching transistors that control a supply time of the data voltages in accordance with signals from gate lines. However, the present disclosure is not limited to this example.

The active layers ACT may be disposed on the buffer film BF. The active layers ACT may include a silicon semiconductor such as polycrystalline silicon, monocrystalline silicon, low-temperature polycrystalline silicon, or amorphous silicon.

The gate insulating film GI may be disposed on the active layers ACT. The gate insulating film GI may be formed as an inorganic film such as, for example, a silicon nitride layer, a silicon oxynitride layer, a silicon oxide layer, a titanium oxide layer, or an aluminum oxide layer.

The gate electrodes G may be disposed on the gate insulating film GI. The gate electrodes G may overlap with the active layers ACT in the third direction Z. The gate electrodes G may be formed as a single layer or multilayers including molybdenum (Mo), aluminum (Al), chromium (Cr), gold (Au), titanium (Ti), nickel (Ni), neodymium (Nd), copper (Cu), or an alloy thereof.

The first interlayer insulating film ILD1 may be disposed on the gate electrodes G. The first interlayer insulating film ILD1 may be formed as an inorganic film such as, for example, a silicon nitride layer, a silicon oxynitride layer, a silicon oxide layer, a titanium oxide layer, or an aluminum oxide layer. The first interlayer insulating film ILD1 may include a is plurality of inorganic films.

Capacitor electrodes CAE may be disposed on the first interlayer insulating film ILD1. The capacitor electrodes CAE may overlap with the gate electrodes G in the third direction Z. The capacitor electrodes CAE may be formed as single layers or multilayers including Mo, Al, Cr, Au, Ti, Ni, Nd, Cu, or an alloy thereof.

First connecting lines CL1 and second connecting lines CL2 may be disposed on the first interlayer insulating film ILD1. The first connecting lines CL1 and the second connecting lines CL2 may be spaced apart from each other in a plan view and disposed between the first and second interlayer insulating films ILD1 and ILD2 and may thereby be electrically insulated.

For example, as illustrated in FIG. 6, (1-1)-th connecting lines CL11, (1-2)-th connecting lines CL12, (1-3)-th connecting lines CL13, (2-1)-th connecting lines CL21, and (2-2)-th connecting lines CL22 may be disposed on the first interlayer insulating film ILD1, and (2-3)-th connecting lines CL23 may also be disposed on the first interlayer insulating film ILD1.

The first connecting lines CL1 and the second connecting lines CL2 may be formed as a single layer or multilayers including Mo, Al, Cr, Au, Ti, Ni, Nd, Cu, or an alloy thereof.

The second interlayer insulating film ILD2 may be disposed on the capacitor electrodes CAE, the first connecting lines CL1, and the second connecting lines CL2. The second interlayer insulating film ILD2 may be formed as an inorganic film such as, for example, a silicon nitride layer, a silicon oxynitride layer, a silicon oxide layer, a titanium oxide layer, or an aluminum oxide layer.

The source electrodes S and the drain electrodes D may be disposed on the second interlayer insulating film ILD2. The source electrodes S and the drain electrodes D may be formed as single layer or multilayers including Mo, Al, Cr, Au, Ti, Ni, Nd, Cu, or an alloy thereof. The source electrodes S and the drain electrodes D may be connected to the active layers ACT through contact holes that penetrate the gate insulating film GI, the first interlayer insulating film ILD1, and the second interlayer insulating film ILD2.

The drain electrodes D of the first TFTs ST1 may be connected to the first or second connecting lines CL1 or CL2 through contact holes that penetrate the second interlayer insulating film ILD2, but the present disclosure is not limited thereto. Alternatively, the source electrodes S of the first TFTs ST1 may be connected to the first or second connecting lines CL1 or CL2. As illustrated in FIG. 6, a drain electrode D of a first TFT ST1 of a first subpixel SPX1 of the first pixel PX1 may be connected to a (1-1)-th connecting line CL11 through a contact hole formed in the second interlayer insulating film ILD2, a drain electrode D of a first TFT ST1 of a second subpixel SPX2 of the first pixel PX1 may be connected to a (1-2)-th connecting line CL12 through a contact hole formed in the second interlayer insulating film ILD2, and a drain electrode D of a first TFT ST1 of a third subpixel SPX3 of the first pixel PX1 (not shown) may be connected to a (1-3)-th connecting line CL13 through a contact hole formed in the second interlayer insulating film ILD2.

Drain electrodes D of first TFTs ST1 of the second pixel PX2 may be connected to (2-1)-th, (2-2)-th, and (2-3)-th connecting lines CL21, CL22, and CL23 through contact holes formed in the second interlayer insulating film ILD2 in the same manner as, or in a similar manner to, the drain electrodes D of the first TFTs ST1 of the first pixel PX1.

The wire connecting electrodes CLCE may be disposed on the second interlayer insulating film ILD2. A wire connecting electrode CLCE may be disposed in each of the sub-copy pixel of each of the copy pixels CPX. The wire connecting electrodes CLCE may be formed as single layers or multilayers including Mo, Al, Cr, Au, Ti, Ni, Nd, Cu, or an alloy is thereof.

The wire connecting electrodes CLCE may be connected to the first or second connecting lines CL1 or CL2 through contact holes that penetrate the second interlayer insulating film ILD2. As illustrated in FIG. 2, wire connecting electrodes CLCE in first and second sub-copy pixels CSPX1 and CXPX2 of the first copy pixel CPX1 may be connected to (1-1)-th and (1-2)-th connecting lines CL11 and CL12 through contact holes formed in the second interlayer insulating film ILD2. Similarly, a third sub-copy pixel CSPX3 of the first copy pixel CPX1 may be connected to a (1-3)-th connecting line CL13 through a contact hole formed in the second interlayer insulating film ILD2.

Wire connecting electrodes CLCE of each of the second and third copy pixels CPX2 and CPX3 may be connected to (1-1)-th, (1-2)-th, and (1-3)-th connecting lines CL11, CL12, and CL13 through a contact hole formed in the second interlayer insulating film ILD2 in the same manner as, or in a similar manner to, the wire connecting electrodes CLCE of the first copy pixel CPX1. Similarly, wire connecting electrodes CLCE of each of the fourth, fifth, and sixth copy pixels CPX4, CPX5, and CPX6 may be connected to (2-1)-th, (2-2)-th, and (2-3)-th connecting lines CL21, CL22, and CL23 through a contact hole formed in the second interlayer insulating film ILD2.

The first planarization film VIA1 may be disposed on the source electrodes S, the drain electrodes D and the wire connecting electrodes CLCE. The first planarization film VIA1 may be formed as an organic film including an acrylic resin, an epoxy resin, a phenolic resin, a polyamide resin, or a polyimide resin.

The pixel connecting electrodes ANDE may be disposed on the first planarization film VIA1. The pixel connecting electrodes ANDE may be connected to the drain electrodes D is of the first TFTs ST1 and the wire connecting electrodes CLCE through contact holes that penetrate the first planarization film VIA1, but the present disclosure is not limited thereto. Alternatively, the pixel connecting electrodes ANDE may be connected to the source electrodes S of the first TFTs ST1 and the wire connecting electrodes CLCE. The pixel connecting electrodes ANDE may be formed as single layers or multilayers including Mo, Al, Cr, Au, Ti, Ni, Nd, Cu, or an alloy thereof.

The second planarization film VIA2 may be disposed on the pixel connecting electrodes ANDE. The second planarization film VIA2 may be formed as an organic film including an acrylic resin, an epoxy resin, a phenolic resin, a polyamide resin, or a polyimide resin.

The barrier films BRR may be disposed on the second planarization film VIA2. The barrier films BRR may be formed as silicon nitride layers, silicon oxynitride layers, silicon oxide layers, titanium oxide layers, or aluminum oxide layers.

The pixel electrodes 171 may be disposed on the barrier films BRR. The pixel electrodes 171 may be connected to the pixel connecting electrodes ANDE through contact holes that penetrate the second planarization film VIA2. The pixel connecting electrodes ANDE may be anode electrodes. The pixel electrodes 171 may be formed as single layers of Mo, Ti, Cu, or Al or as stacks of Al and Ti (e.g., Ti/Al/Ti), stacks of Al and indium tin oxide (ITO) (e.g., ITO/A1/ITO), layers of a silver-palladium-copper (APC) alloy, or stacks of an APC alloy and
ITO (e.g., ITO/APC/ITO).

A pixel electrode 171 may be disposed in each of the subpixels of each of the pixels PX or in each of the sub-copy pixels of each of the copy pixels CPX. Pixel electrodes 171 of the subpixels of each of the pixels PX may be electrically connected to pixel electrodes 171 of is the sub-copy pixels of each of the copy pixels CPX via the pixel connecting electrodes ANDE, the drain electrodes D of the first TFTs ST1, the first connecting lines CL1 (or the second connecting lines CL2), and the wire connecting electrodes CLCE. Accordingly, almost the same voltages may be applied to the pixel electrodes 171 of the subpixels of each of the pixels PX and to the pixel electrodes 171 of the sub-copy pixels of each of the copy pixels CPX.

The light-emitting layers 172 may be disposed on the pixel electrodes 171. For example, the light-emitting layers 172 may be organic light-emitting layers including an organic material, but the present disclosure is not limited thereto.

The bank BNK may be disposed on the barrier films BRR. The bank BNK may be disposed to cover the edges of each of the pixel electrodes 171. The bank BNK may define light emitting regions of the pixels PX, the copy pixels CPX, the subpixels of each of the pixels PX, and the sub-copy pixels of each of the copy pixels CPX. The pixels PX, the copy pixels CPX, the subpixels of each of the pixels PX, and the sub-copy pixels of each of the copy pixels CPX may include emission areas that emit light, but the present disclosure is not limited thereto. The bank BNK may be formed as an organic film including an acrylic resin, an epoxy resin, a phenolic resin, a polyamide resin, or a polyimide resin.

The common electrode CME may be disposed on the light-emitting layers 172 to cover the light-emitting layers 172. The common electrode CME may be a common layer formed in common in the pixels PX and the copy pixels CPX. The common electrode CME may be formed of a transparent conductive material capable of transmitting light therethrough, such as ITO or indium zinc oxide (IZO), or a semitransparent metallic material such as magnesium (Mg), silver (Ag), or an alloy thereof. An encapsulation layer (not shown) including at least one organic film and at least one inorganic film may be further disposed on the is common electrode CME.

Referring to FIGS. 3 through 6, the display panel DP may further include holes T_U which are disposed between the pixels PX and the copy pixels CPX.

The holes T_U may be formed by partially removing parts of at least one of the first planarization film VIA1, the second planarization film VIA2, and the bank BNK disposed between the pixels PX and the copy pixels CPX.

The holes T_U may be disposed in the bending region RR, the first boundary region BR1, and the second boundary region BR2. The holes T_U may be further disposed in the extended region ER or the main region MR, but the present disclosure is not limited thereto. Alternatively, the holes T_U may not be provided in the extended region ER or the main region MR.

As illustrated in FIGS. 4 and 5, the holes T_U may form a lattice shape that extends between the copy pixels CPX in a plan view and may be recessed toward the substrate SUB to have, for example, a trench shape. The width of the holes T_U may decrease closer to the substrate SUB, but the present disclosure is not limited thereto.

In a cross-sectional view, the barrier films BRR may be formed to protrude into the holes T_U. Accordingly, in a cross-sectional view, the holes T_U may have such a shape (e.g., a pot shape, an eaves shape, or an undercut shape in cross-sectional view) that the minimum distance between the barrier films BRR is relatively smaller than the maximum width of the holes T_U.

In a cross-sectional view, the holes T_U may be formed through the bank BNK and the second planarization film VIA2. As illustrated in FIG. 6, the holes T_U may be formed in the bank BNK and the second planarization film VIA2 in the first boundary region BR1. The is holes T_U may also be formed in the bank BNK and the second planarization film VIA2 in the second boundary region BR2. As will be described later, as cutout portions T_L in the bending region RR are filled with the first planarization film VIA1, the holes T_U may not be formed in the first planarization film VIA1 in the bending region RR.

Referring to FIG. 6, the display panel DP may further include the cutout portions T_L which are disposed between the copy pixels CPX.

The cutout portions T_L may be disposed in the bending region RR. The cutout portions T_L may be further disposed between the bending region RR and the first boundary region BR1 (particularly, between the second pixel PX2 and the first copy pixel CPX1), but the present disclosure is not limited thereto.

The cutout portions T_L may be formed in at least one inorganic film. The cutout portions T_L may be formed by removing parts of the at least one inorganic film disposed between the copy pixels CPX. For example, the cutout portions T_L may be formed by removing parts of the second interlayer insulating film ILD2 disposed between the copy pixels CPX. The cutout portions T_L may also be referred to as holes or penetrations.

As illustrated in FIG. 6, the cutout portions T_L may have a hole shape penetrating the second interlayer insulating film ILD2 in a cross-sectional view. The width of the cutout portions T_L may decrease closer to the substrate SUB, but the present disclosure is not limited thereto.

The cutout portions T_L may be filled with the first planarization film VIA1. Parts of the first interlayer insulating film ILD1 that are exposed by the cutout portions T_L may be covered by the first planarization film VIA1. In a cross-sectional view, the first planarization film VIA1 which fills the cutout portions T_L, may be connected continuously throughout the is pixels PX or the copy pixels CPX, but the present disclosure is not limited thereto. Alternatively, in a cross-sectional view, the first planarization film VIA1, which fills the cutout portions T_L, may be separated between the pixels PX or between the copy pixels CPX.

Referring to FIGS. 4 and 5, in a plan view, the cutout portions T_L may have a similar shape to the holes T_U, for example, a lattice shape that extends between the copy pixels CPX in a plan view, but the present disclosure is not limited thereto. The cutout portions T_L may have various other shapes such as, for example, a slit shape, a dot shape, or a stripe shape, in a plan view.

As the holes T_U or the cutout portions T_L are disposed in the first boundary region BR1, the second boundary region BR2, and the bending region RR, stress applied to the display panel DP when the display DP is being moved can be reduced. Also, as the provision of inorganic films in the bending region RR can be minimized, the flexibility of the display panel DP can be improved. Referring to FIGS. 7 and 8, parts of the first connecting lines CL1, the second connecting lines CL2, the third connecting lines CL3, and the fourth connecting lines CL4 that are exposed by the cutout portions T_L may be covered by the first planarization film VIA1 and may thus be electrically insulated.

For example, as illustrated in FIGS. 7 and 8, parts of the (1-1)-th connecting lines CL11 may overlap with the holes T_U and the cutout portions T_L in the third direction Z. Parts of the (1-1)-th connecting lines CL11 that are exposed by the cutout portions T_L may be covered by the first planarization film VIA1. The parts of the (1-1)-th connecting lines CL11 that are exposed by the cutout portions T_L may be in direct contact with the first planarization film VIA1. The parts of the (1-1)-th connecting lines CL11 that are exposed by the cutout portions T_L may be electrically insulated by the first planarization film VIA1. Similarly, parts is of the (1-2)-th connecting lines CL12, the (1-3)-th connecting lines CL13, the (2-1)-th connecting lines CL21, the (2-2)-th connecting lines CL22, or the (2-3)-th connecting lines CL23 that are exposed by the cutout portions T_L may overlap with the holes T_U and the cutout portions T_L in the third direction Z. The parts of the (1-2)-th connecting lines CL12, the (1-3)-th connecting lines CL13, the (2-1)-th connecting lines CL21, the (2-2)-th connecting lines CL22, or the (2-3)-th connecting lines CL23 that are exposed by the cutout portions T_L may be covered by the first planarization film VIA1.

Figure 9:
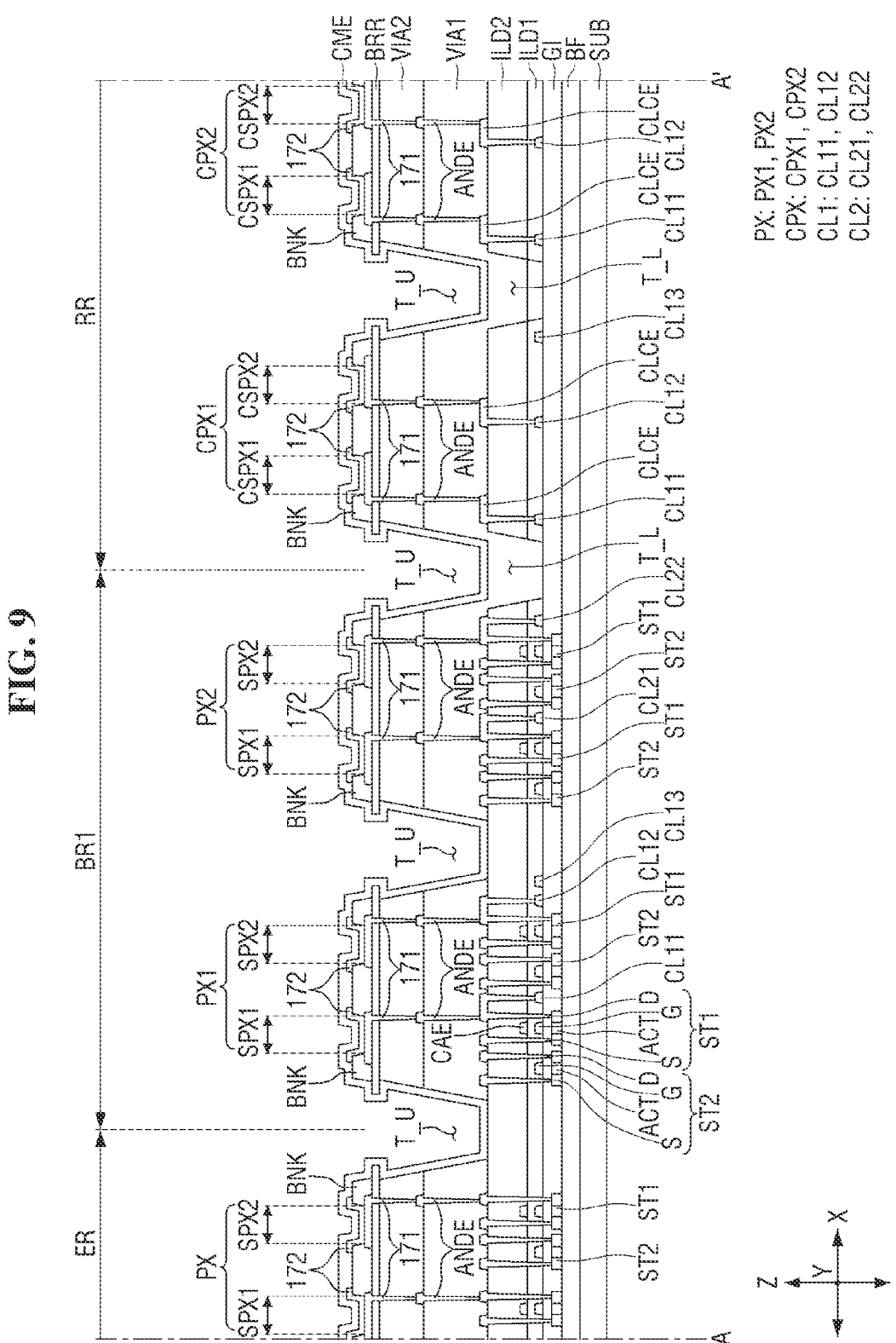
FIG. 9 is a cross-sectional view, taken along line A-A' of FIG. 4, of a display panel according to another embodiment of the present disclosure.
Figure 10:
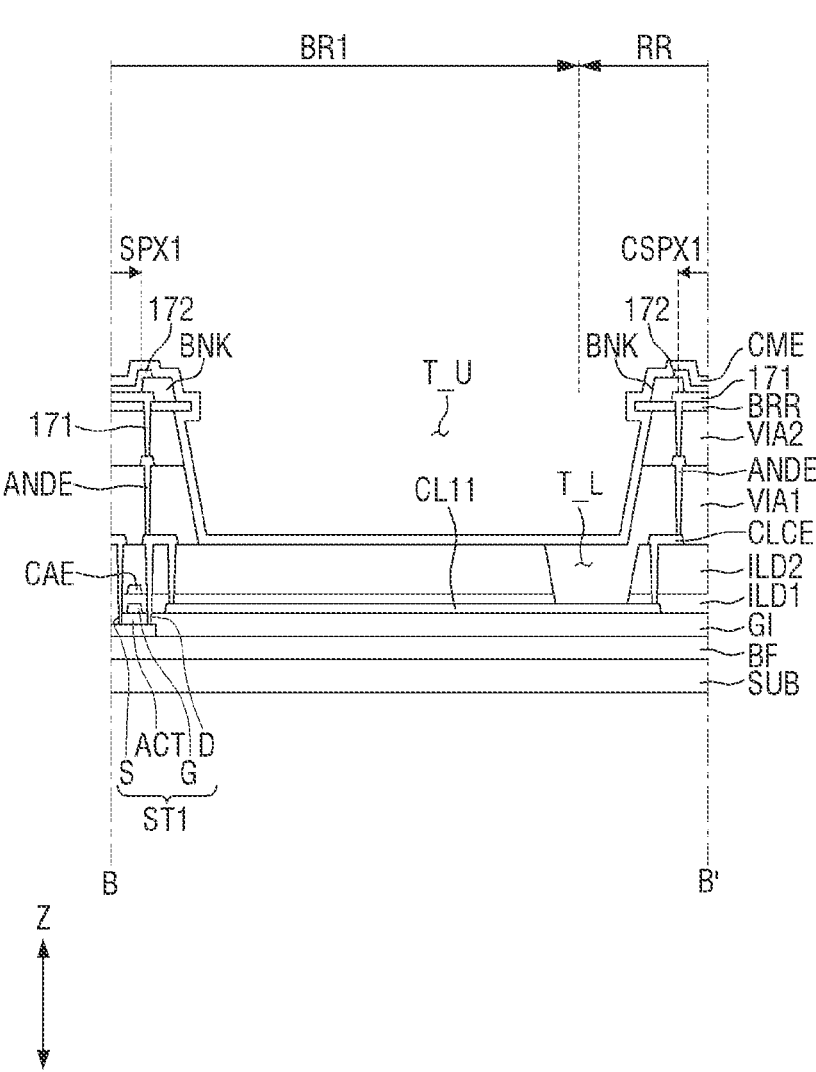
FIG. 10 is a cross-sectional view, taken along line B-B' of FIG. 4, of the display panel of FIG. 9.
Figure 11:
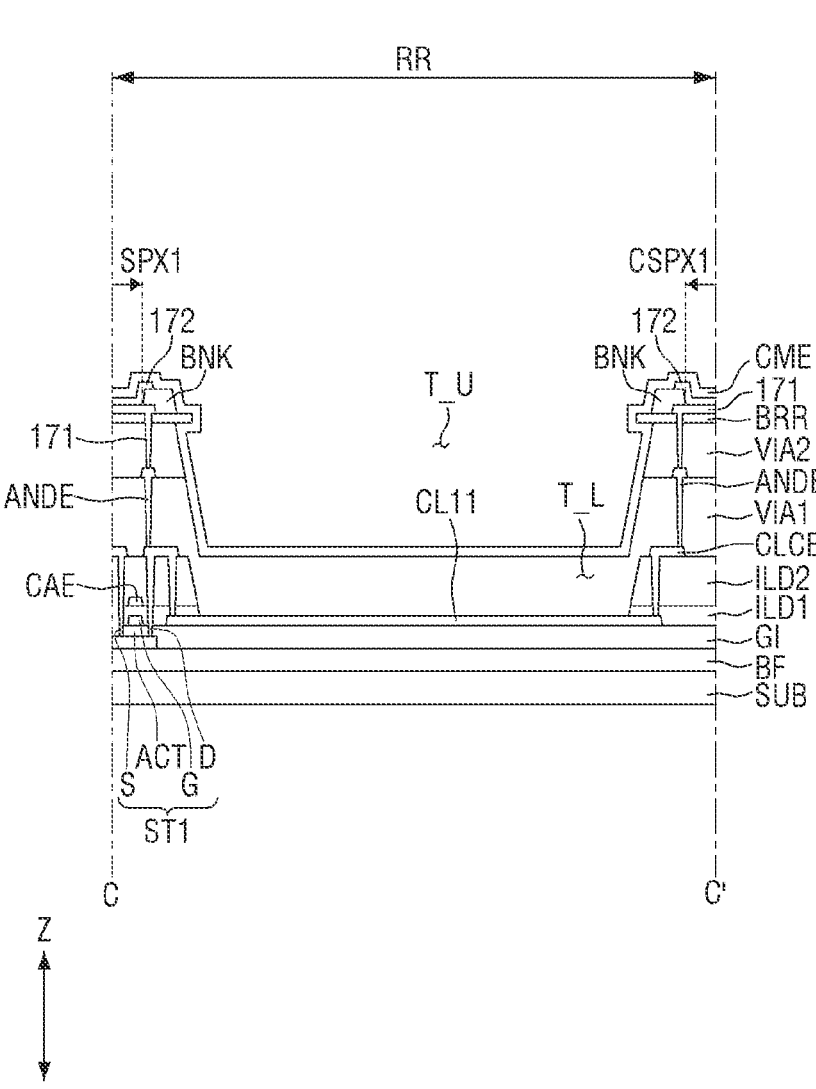
FIG. 11 is a cross-sectional view, taken along line C-C' of FIG. 4, of the display panel of FIG. 9.

FIG. 9 is a cross-sectional view, taken along line A-A' of FIG. 4, of a display panel according to another embodiment of the present disclosure. FIG. 10 is a cross-sectional view, taken along line B-B' of FIG. 4, of the display panel of FIG. 9. FIG. 11 is a cross-sectional view, taken along line C-C' of FIG. 4, of the display panel of FIG. 9.

The embodiment of FIGS. 9 through 11 differs from the embodiment of FIGS. 1 through 8 in that a plurality of connecting lines (CL1, CL2, CL3, and CL4) are disposed on a gate insulating film GI.

Referring to FIGS. 5, 6, and 9 through 11, the connecting lines (CL1, CL2, CL3, and CL4) may be disposed on the gate insulating film GI and may be covered by a first interlayer insulating film ILD1. For example, as illustrated in FIG. 9, (1-1)-th, (1-2)-th, (1-3)-th, (2-1)-th, and (2-2)-th connecting lines CL11, CL12, CL13, CL21, and CL22 may be disposed on the gate insulating film GI, and a (2-3)-th connecting line CL23 may be disposed on the gate insulating film GI. The connecting lines (CL1, CL2, CL3, and CL4) may be disposed between the gate insulating film GI and the first interlayer insulating film ILD1 and may thus be electrically insulated by the gate insulating film GI and the first interlayer insulating film ILD1.

Drain electrodes D of first TFTs ST1 may be connected to the connecting lines (CL1, CL2, CL3, and CL4) through contact holes that penetrate the first interlayer insulating film ILD1 and a second interlayer insulating film ILD2. For example, as illustrated in FIG. 9, a drain electrode D of a first TFT ST1 of a first subpixel SPX1 of a first pixel PX1 may be connected to the (1-1)-th connecting line CL12 through a contact hole formed in the first and second interlayer insulating films ILD1 and ILD2, a drain electrode D of a first TFT ST1 of a second subpixel SPX2 of the first pixel PX1 may be connected to the (1-2)-th connecting line CL12 through a contact hole formed in the first and second interlayer insulating films ILD1 and ILD2, and a drain electrode D of a first TFT ST1 of a third subpixel SPX3 of the first pixel PX1 (not shown) may be connected to the (1-3)-th connecting line CL13 through a contact hole formed in the first and second interlayer insulating films ILD1 and ILD2.

Drain electrodes D of first TFTs ST1 of a second pixel PX2 may be connected to the (2-1)-th, (2-2)-th, and (2-3)_th connecting lines CL21, CL22, and CL23 through contact holes formed in the first and second interlayer insulating films ILD1 and ILD2 in the same manner as, or in a similar manner to, the drain electrodes D of the first TFTs ST1 of the first pixel PX1.

Wire connecting electrodes CLCE may be connected to the connecting lines (CL1, CL2, CL3, and CL4) through contact holes that penetrate the first and second interlayer insulating films ILD1 and ILD2. For example, as illustrated in FIG. 9, wire connecting electrodes CLCE disposed in first and second sub-copy pixels CSPX1 and CSPX2 of a first copy pixel CPX1 may be connected to the (1-1)-th and (1-2)-th connecting lines CL11 and CL12 through contact holes formed in the first and second interlayer insulating films ILD1 and ILD2. Similarly, a wire connecting electrode CLCE disposed in a third sub-copy pixel CSPX3 of the first copy pixel CPX1 (not shown) may be connected to the (1-3)-th connecting line CL13 through a contact hole formed in the first and second interlayer insulating films ILD1 and ILD2.

Wire connecting electrodes CLCE of each of the second and third copy pixels CPX2 and CPX3 may be connected to (1-1)-th, (1-2)-th, and (1-3)-th connecting lines CL11, CL12, and CL13 through a contact hole formed in the first and second interlayer insulating films ILD1 and ILD2 in the same manner as, or in a similar manner to, the wire connecting electrodes CLCE of the first copy pixel CPX1. Similarly, wire connecting electrodes CLCE of each of fourth, fifth, and sixth copy pixels CPX4, CPXS, and CPX6 may be respectively connected to the (2-1)-th, (2-2)-th, and (2-3)-th connecting lines CL21, CL22, and CL23 through a contact hole formed in the first and second interlayer insulating films ILD1 and ILD2.

Cutout portions T_L may be formed in the first and second interlayer insulating films ILD1 and ILD2. The cutout portions T_L may be formed by removing parts of the first and second interlayer insulating films ILD1 and ILD2 disposed between a plurality of copy pixels CPX.

In a cross-sectional view, the cutout portions T_L may have a hole shape penetrating the first and second interlayer insulating films ILD1 and ILD2. The cutout portions T_L may be filled with a first planarization film VIA1. Parts of the gate insulating film GI that are exposed by the cutout portions T_L may be covered by the first planarization film VIA1.

Referring to FIGS. 10 and 11, parts of first, second, third, and fourth connecting lines CL1, CL2, CL3, and CL4 may overlap with the cutout portions T_L in the third direction Z. Parts of the first, second, third, and fourth connecting lines CL1, CL2, CL3, and CL4 that are exposed by the cutout portions T_L may be covered by the first planarization film VIA1 and may thus be electrically insulated. For example, as illustrated in FIGS. 10 and 11, part of the (1-1)-th connecting line CL11 that is exposed by a cutout portion T_L may be covered by the first planarization film VIA1 and may thus be electrically insulated.

Referring to FIGS. 4 through 11, the connecting lines (CL1, CL2, CL3, and CL4) may be disposed on one layer, but the present disclosure is not limited thereto. Alternatively, the connecting lines (CL1, CL2, CL3, and CL4) may be a dual connecting lines connected to each other. The connecting lines (CL1, CL2, CL3, and CL4) may include a first connecting lines disposed on the gate insulating film GI and a second connecting lines disposed on the first interlayer insulating film ILD1. The first connecting lines that are disposed on the gate insulating film GI and the second connecting lines that are disposed on the first interlayer insulating film ILD1 may be connected through contact holes that penetrate the first interlayer insulating film ILD1, respectively.

The embodiment of FIGS. 9 through 11 is almost the same as the embodiment of FIGS. 1 through 8 except that the first and second connecting lines CL1 and CL2 are disposed on the gate insulating film GI, and thus, a further detailed description thereof will be omitted.

Figure 12:
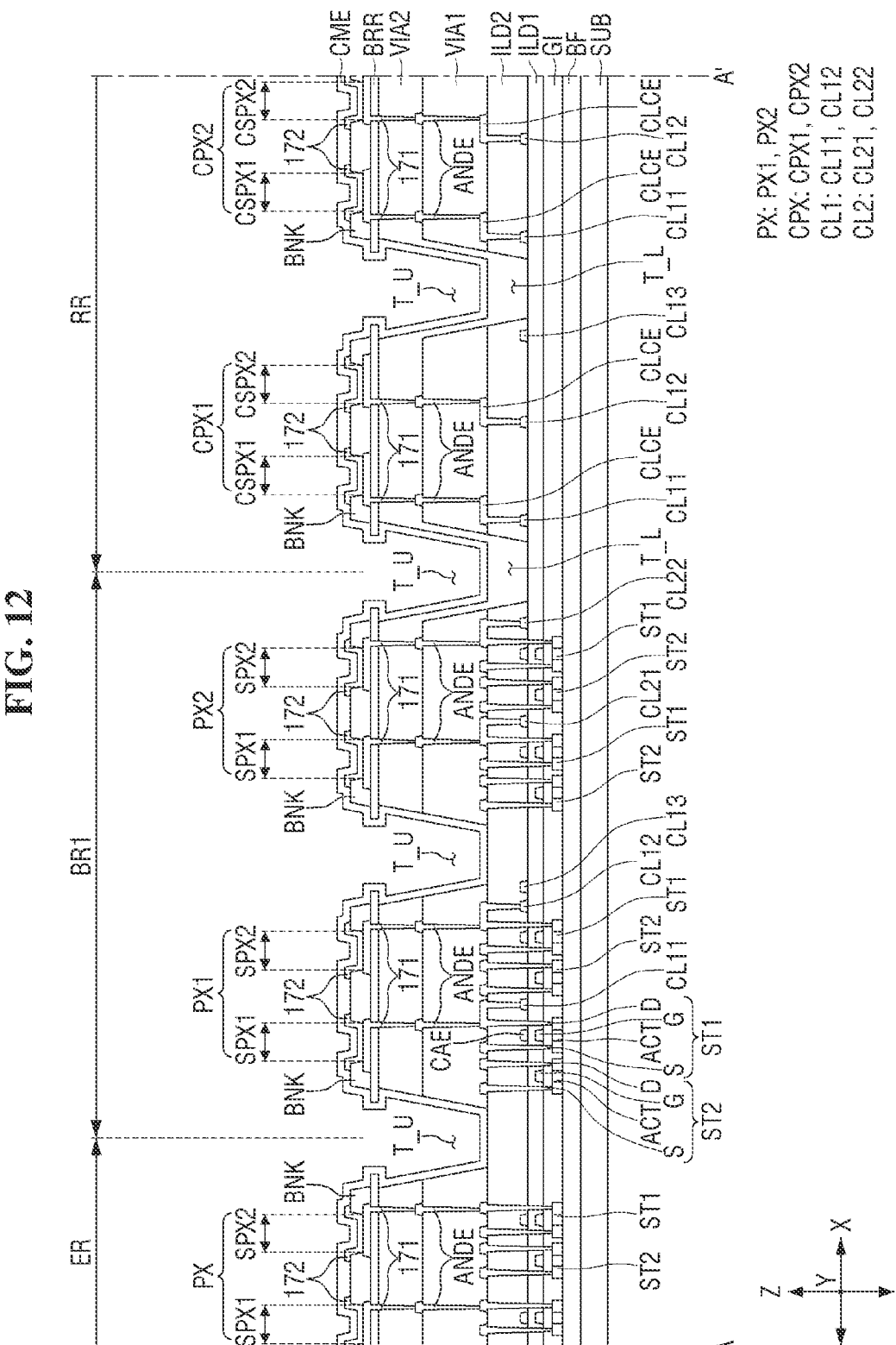
FIG. 12 is a cross-sectional view, taken along line A-A' of FIG. 4, of a display panel according to another embodiment of the present disclosure.

FIG. 12 is a cross-sectional view, taken along line A-A' of FIG. 4, of a display panel according to another embodiment of the present disclosure.

The embodiment of FIG. 12 differs from the embodiment of FIGS. 1 through 8 in that cutout portions T_L are filled with a second planarization film VIA2.

Referring to FIG. 12, the cutout portions T_L may be filled with the second planarization film VIA2. The second planarization film VIA2, which fills the cutout portions T_L, may be in direct contact with a first interlayer insulating film ILD1. In a cross-sectional view, the second planarization film VIA2 which fills the cutout portions T_L may be connected continuously throughout pixels PX or copy pixels CPX, but the present disclosure is not limited thereto. Alternatively, in a cross-sectional view, the second planarization film VIA2 which fills the cutout portions T_L may be separated between the pixels PX or between the copy pixels CPX.

Referring to FIGS. 5, 6, and 12, as the cutout portions T_L are filled with the second planarization film VIA2, parts of a plurality of connecting lines (CL1, CL2, CL3, and CL4) that are exposed by the cutout portions T_L may be covered by the second planarization film VIA2 and may thus be electrically insulated. For example, parts of the first planarization film VIA1 that fill the cutout portions T_L may be replaced with the second planarization film VIA2. As a result, part of the (1-1)-th connecting line CL11 may be covered by the second planarization film VIA2 and may thus be electrically insulated.

The embodiment of FIG. 12 is almost the same as the embodiment of FIGS. 1 through 8 except that the cutout portions T_L are filled with the second planarization film VIA2, and thus, a further detailed description thereof will be omitted.

Figure 13:
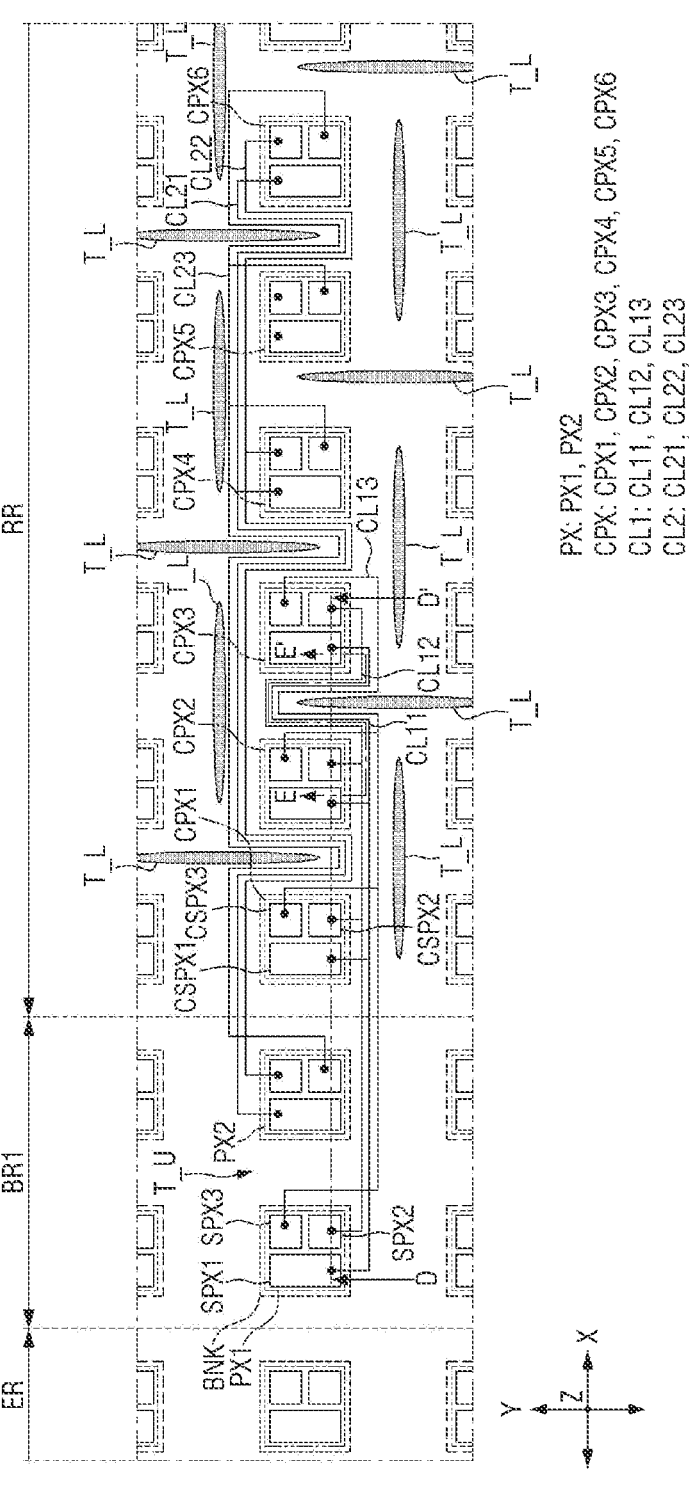
FIG. 13 is an enlarged plan view of a first boundary region and its surroundings of a display panel according to another embodiment of the present disclosure.
Figure 14:
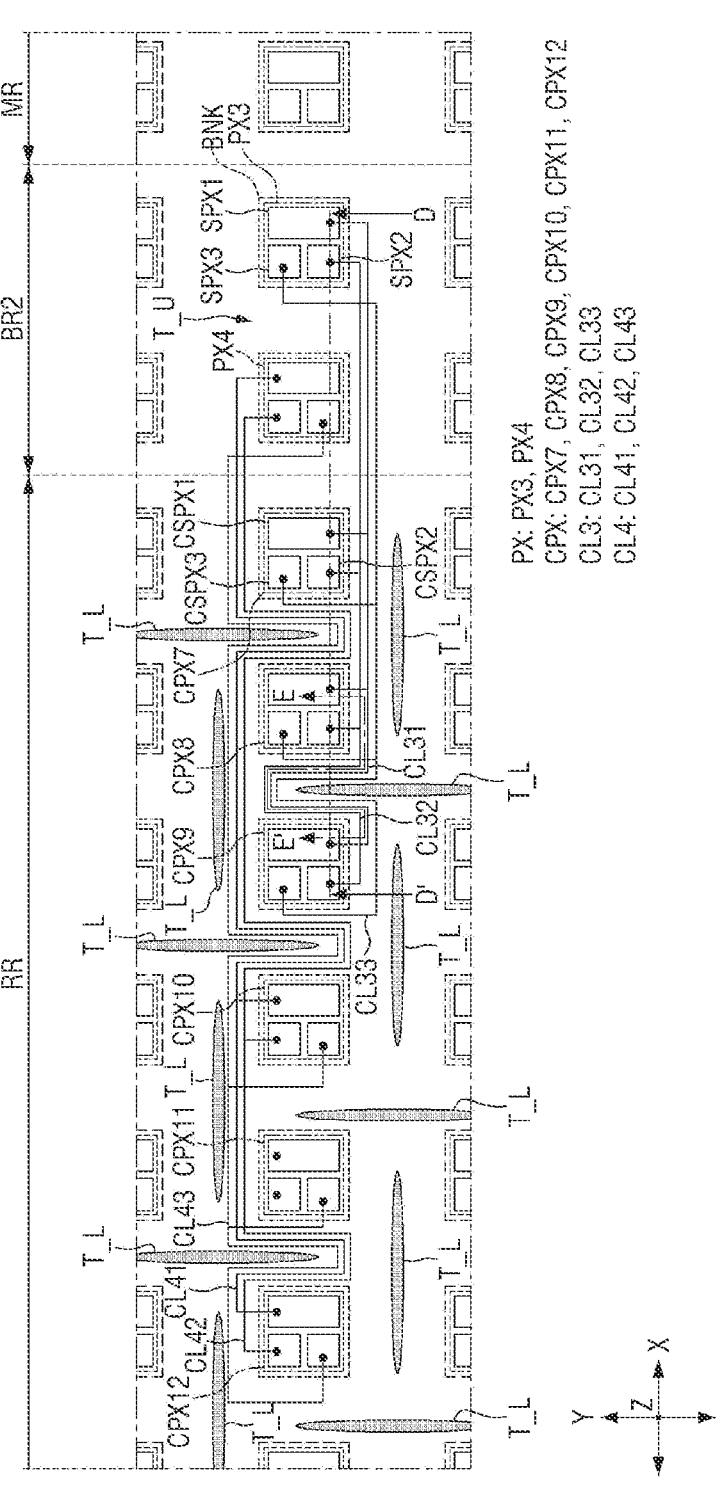
FIG. 14 is an enlarged plan view of a second boundary region and its surroundings of the display panel of FIG. 13.

FIG. 13 is an enlarged plan view of a first boundary region and its surroundings of a display panel according to another embodiment of the present disclosure. FIG. 14 is an enlarged plan view of a second boundary region and its surroundings of the display panel of FIG.

Figure 15:
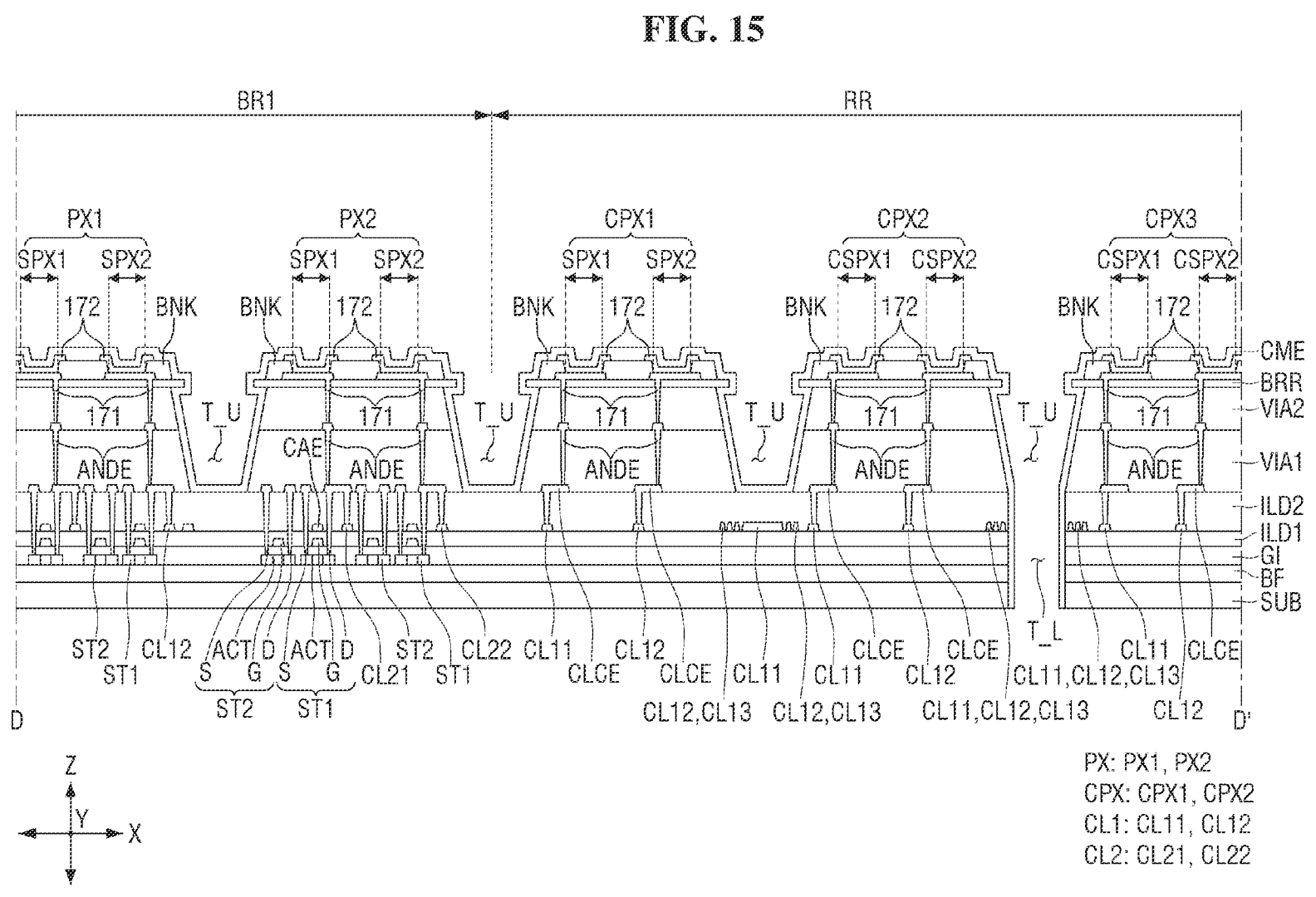
Figure 16:
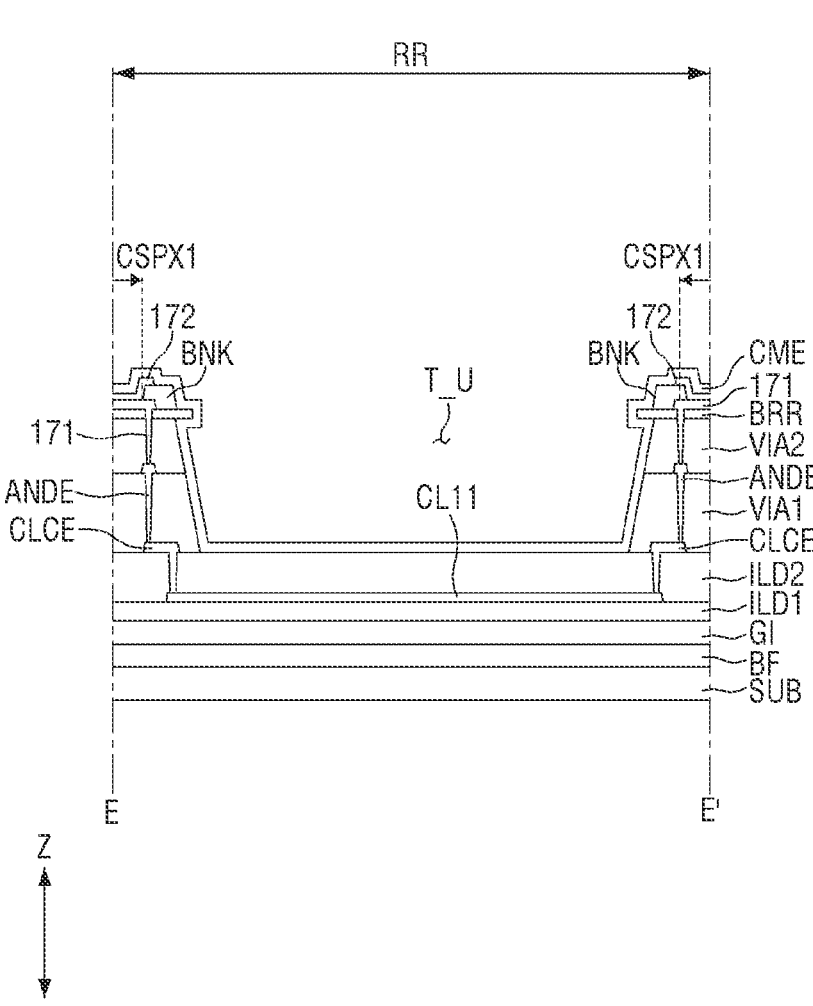
FIG. 16 is a cross-sectional view, taken along line E-E' of FIG. 13, of the display panel of FIG. 13.

13. FIG. 15 is a cross-sectional view, taken along line D-D' of FIG. 13, of the display panel of FIG. 13. FIG. 16 is a cross-sectional view, taken along line E-E' of FIG. 13, of the display panel of FIG. 13.

The embodiment of FIGS. 13 through 18 differs from the embodiment of FIGS. 1 through 8 in that a plurality of cutout portions T_L are formed to penetrate a display panel DP.

Referring to FIGS. 13 and 14, the cutout portions T_L may be disposed between a plurality of copy pixels CPX in a bending region RR to form a particular pattern in a plan view.

As illustrated in FIGS. 13 and 14, the cutout portions T_L may be arranged regularly in a plan view, but the present disclosure is not limited thereto. The cutout portions T_L may is be arranged irregularly in a plan view.

As illustrated in FIGS. 13 and 14, a plurality of pixels PX and a plurality of copy pixels CPX may be arranged in a matrix having multiple rows and multiple columns in a plan view. In a plan view, some of the cutout portions T_L may extend in the row direction of and some of the cutout portions T_L may extend in the column direction. The row direction and the column direction may be the first and second directions X and Y, respectively. For example, in a plan view, some of the cutout portions T_L may have a slit shape that extends in the first direction X, and some of the cutout portions T_L may have a slit shape that extends in the second direction Y. However, the present disclosure is not limited to this example. Alternatively, the directions of the rows and the columns of the matrix may be diagonal directions that intersect the first and second directions X and Y.

Cutout portions T_L that extend in the first direction X may be disposed between rows of copy pixels CPX. Each of the cutout portions T_L that extend in the first direction X may be disposed to overlap with at least two columns of copy pixels CPX in the second direction Y. Each of the cutout portions T_L that extend in the first direction X may overlap with a cutout portion T_L that extend in the second direction Y between at least two columns of copy pixels CPX.

Cutout portions T_L that extend in the second direction Y may be disposed between columns of copy pixels CPX. Each of the cutout portions T_L that extend in the second direction Y may be disposed to overlap with at least two rows of copy pixels CPX in the first direction X. Each of the cutout portions T_L that extend in the second direction Y may overlap with a cutout portion T_L that extends in the first direction X between at least two rows of copy pixels CPX.

As illustrated in FIGS. 13 and 14, first, second, third, and fourth connecting lines CL1, CL2, CL3, and CL4 may be disposed to bypass the cutout portions T_L and thus not overlap with the cutout portions TL in the third direction Z.

For example, as illustrated in FIG. 13, (1-1)-th, (1-2)-th, and (1-3)-th connecting lines CL11, CL12, and CL13 may be disposed to surround one end portion of a cutout portion T_L disposed between second and third copy pixels CPX2 and CPX3. In a plan view, parts of the (1-1)-th, (1-2)-th, and (1-3)-th connecting lines CL11, CL12, and CL13 near one end portion of the cutout portion T_L disposed between the second and third copy pixels CPX2 and CPX3 may have a U shape, and the cutout portion T_L disposed between the second and third copy pixels CPX2 and CPX3 may be disposed in a region surrounded by the U-shaped parts of the (1-1)-th, (1-2)-th, and (1-3)-th connecting lines CL11, CL12, and CL13. For example, (2-1)-th, (2-2)-th, and (2-3)-th connecting lines CL21, CL22, and CL23 may be disposed to surround one end portion of a cutout portion T_L disposed between a first copy pixel CPX1 and the second copy pixel CPX2 and one end portion of an cutout portion T_L between the third copy pixel CPX3 and a fourth copy pixel CPX4.

Similarly, as illustrated in FIG. 14, (3-1)-th, (3-2)-th, and (3-3)-th connecting lines CL31, CL32, and CL33 and (4-1)-th, (4-2)-th, and (4-3)-th connecting lines CL41, CL42, and CL43 may be disposed to surround end portions of cutout portions T_L between seventh through twelfth copy pixels CPX7 through CPX12.

The layout and the shape of the first, second, third, and fourth connecting lines CL1, CL2, CL3, and CL4 are not particularly limited but may vary depending on the layout and the shape of the cutout portions T_L.

Referring to FIG. 15, in a cross-sectional view, the cutout portions T_L may be is disposed to penetrate a substrate SUB, a gate insulating film G, a first interlayer insulating film ILD1, and a second interlayer insulating film ILD2. The cutout portions T_L may communicate with holes T_U, which are disposed between the copy pixels CPX, and may thus form holes that completely penetrate the display panel DP in the third direction Z.

Referring to FIGS. 13, 14, and 16, as the (1-1)-th connecting line CL11 is disposed to bypass the cutout portions T_L, as already mentioned above, pixel electrodes 171 of first sub-copy pixels CSPX1 of the first, second, and third copy pixels CPX1, CPX2, and CPX3 may be connected by the (1-1)-th connecting line CL11. Parts of the first connecting line CL1 that overlap with the holes T_U, for example, parts of the (1-1)-th connecting line CL11, may be covered by the second interlayer insulating film ILD2 and may thus be electrically insulated. The second, third, and fourth connecting lines CL2, CL3, and CL4 may connect sub-copy pixels of each of the copy pixels CPX in the same manner as, or in a similar manner to, the first connecting line CL1.

The embodiment of FIGS. 13 through 16 is almost the same as the embodiment of FIGS. 1 through 8 except that the cutout portions T_L are formed to penetrate the display panel DP, and thus, a further detailed description thereof will be omitted.

Figure 17:
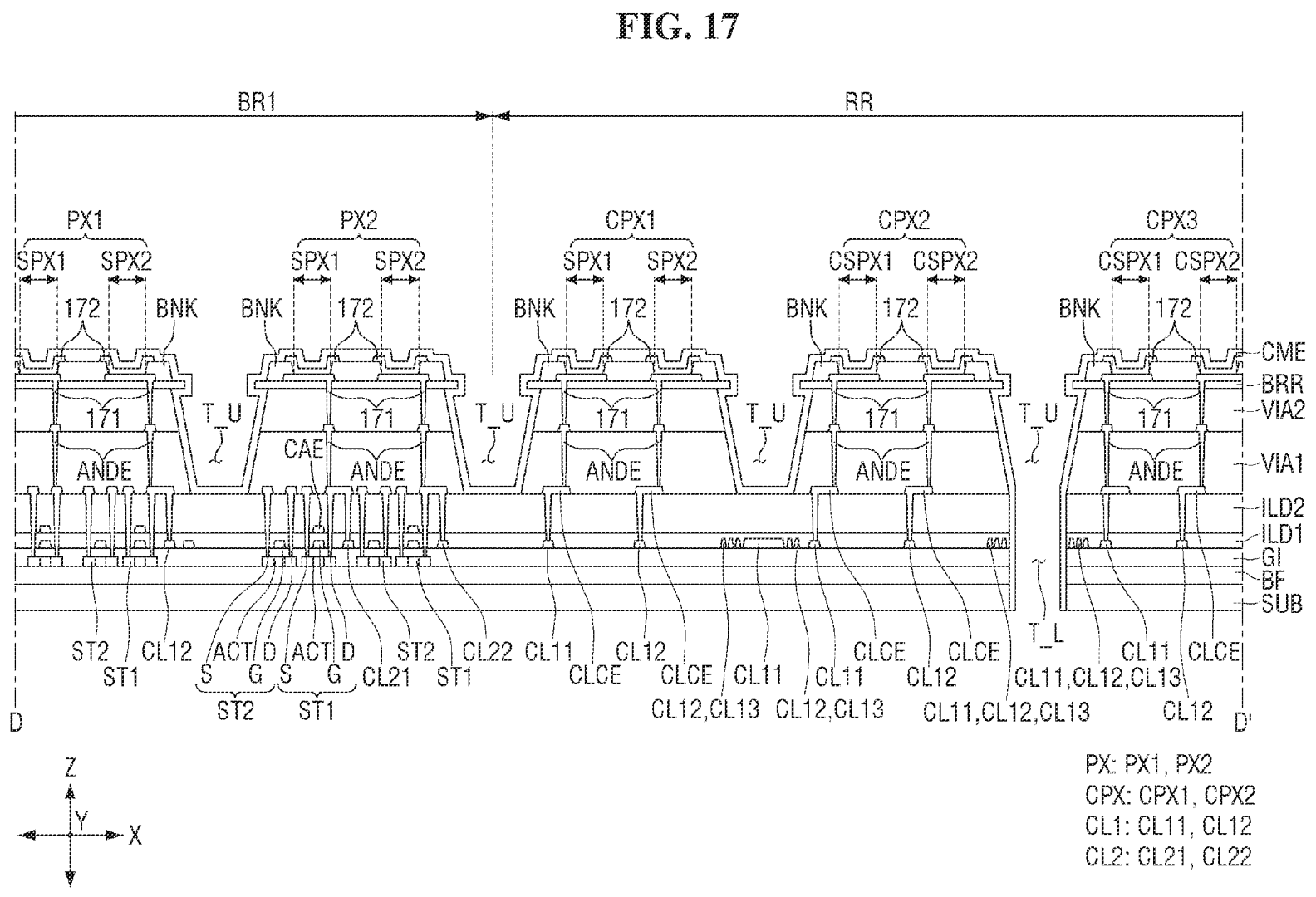
Figure 18:
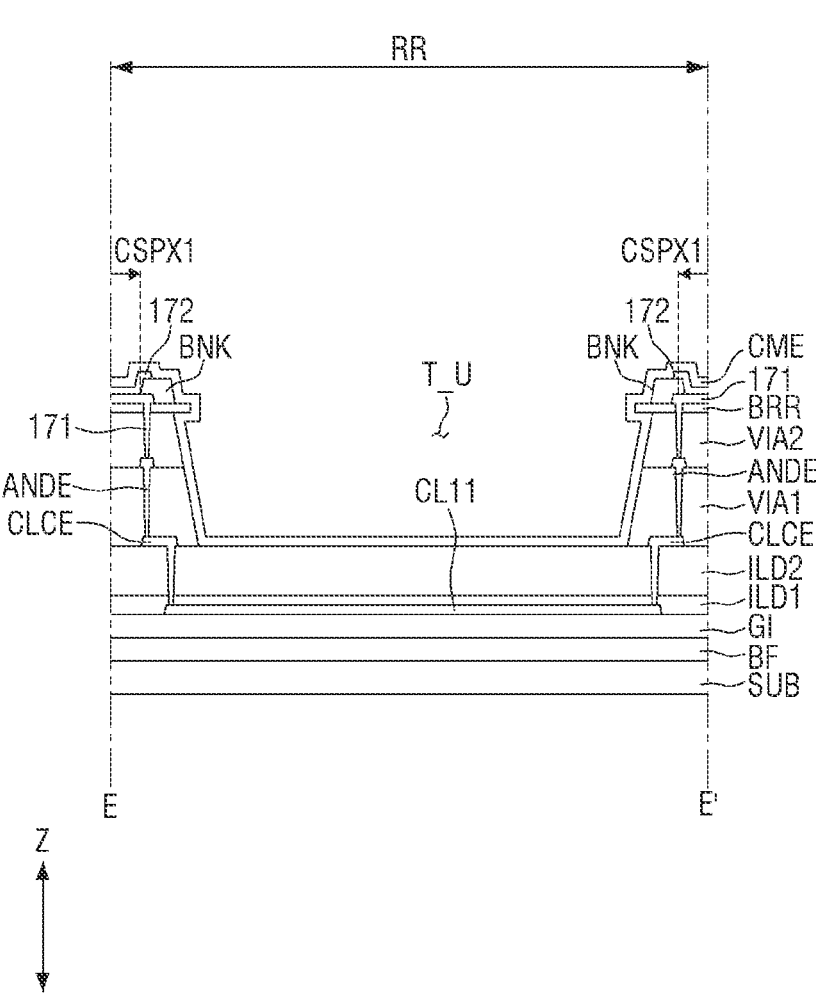
FIG. 18 is a cross-sectional view, taken along line E-E' of FIG. 13, of the display panel of FIG. 17.

FIG. 17 is a cross-sectional view, taken along line D-D' of FIG. 13, of a display panel according to another embodiment of the present disclosure. FIG. 18 is a cross-sectional view, taken along line E-E' of FIG. 13, of the display panel of FIG. 17.

The embodiment of FIGS. 17 and 18 differs from the embodiment of FIGS. 13 through 16 in that a plurality of connecting lines (CL1, CL2, CL3, and CL4) are disposed on a gate insulating film GI.

Referring to FIGS. 13, 14, 17, and 18, the connecting lines (CL1, CL2, CL3, and CL4) may be disposed on the gate insulating film GI and may be covered by a first interlayer insulating film ILD1. Drain electrodes D of first TFTs ST1 may be connected to the connecting lines (CL1, CL2, CL3, and CL4) through contact holes that penetrate the first interlayer insulating film ILD1 and a second interlayer insulating film ILD2. Wire connecting electrodes CLCE may be connected to the connecting lines (CL1, CL2, CL3, and CL4) through contact holes that penetrate the first and second interlayer insulating films ILD1 and ILD2.

The embodiment of FIGS. 17 and 18 is almost the same as the embodiments of FIGS. 9 through 11 except for the layout of the connecting lines (CL1, CL2, CL3, and CL4).

In the embodiment of FIGS. 17 and 18, unlike in the embodiment of FIGS. 10 and 11, the connecting lines (CL1, CL2, CL3, and CL4) may overlap with holes T_U in the third direction Z, but not with cutout portions T_L in the third direction Z.

Parts of the connecting lines (CL1, CL2, CL3, and CL4) that overlap with the holes T_U in the third direction Z may be covered by the first and second interlayer insulating films ILD1 and ILD2 and may thus be electrically insulated. For example, as illustrated in FIG. 18, parts of a (1-1)-th connecting line CL11 may overlap with the holes T_U in the third direction Z and may be covered by the first and second interlayer insulating films ILD1 and ILD2.

The embodiment of FIGS. 17 and 18 is almost the same as the embodiments of FIGS. 13 through 16 except that the connecting lines (CL1, CL2, CL3, and CL4) are disposed on the gate insulating film GI, and thus, a further detailed description thereof will be omitted.

Figure 19:
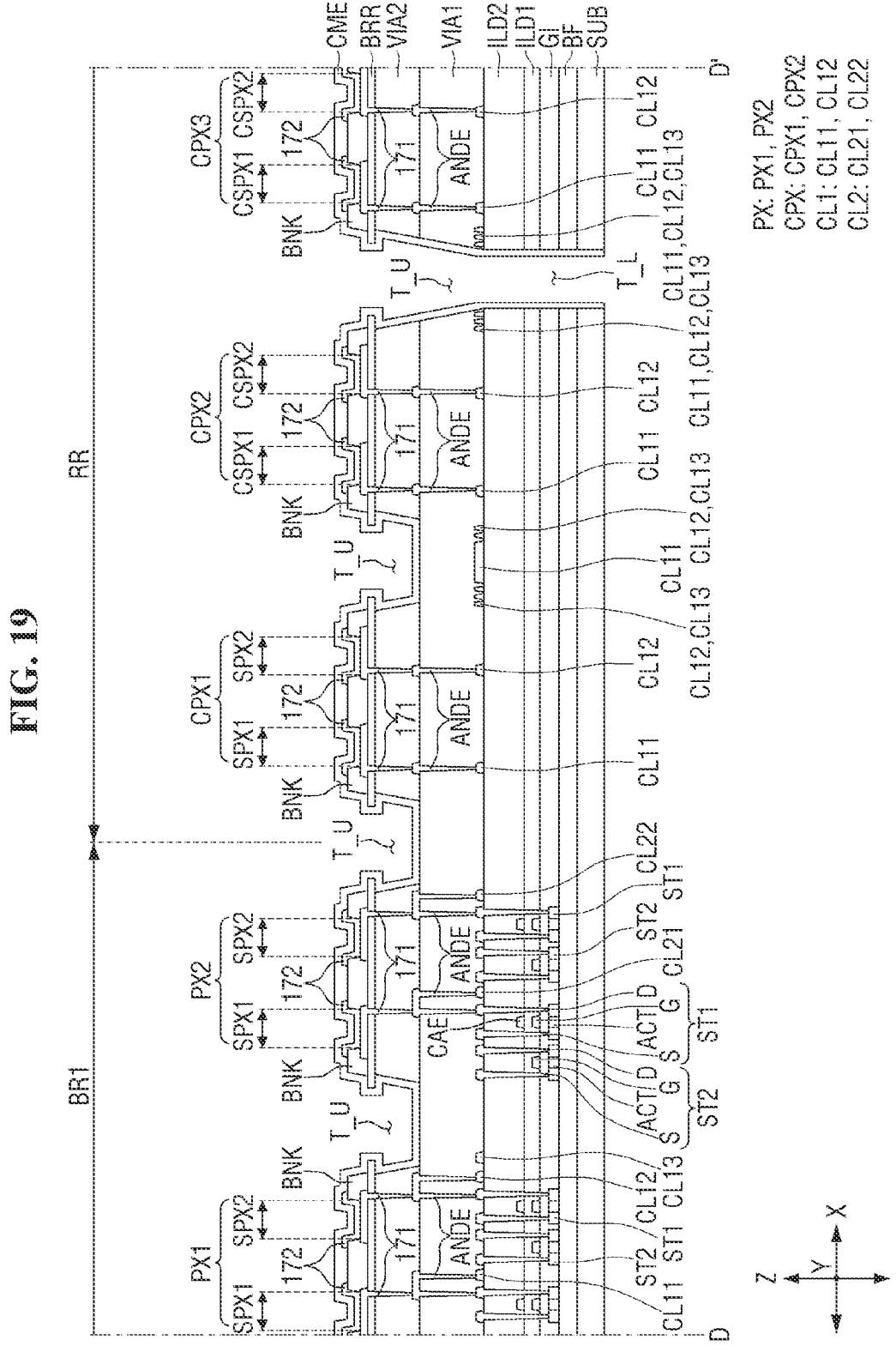
FIG. 19 is a cross-sectional view, taken along line D-D' of FIG. 13, of a display panel according to another embodiment of the present disclosure.
Figure 20:
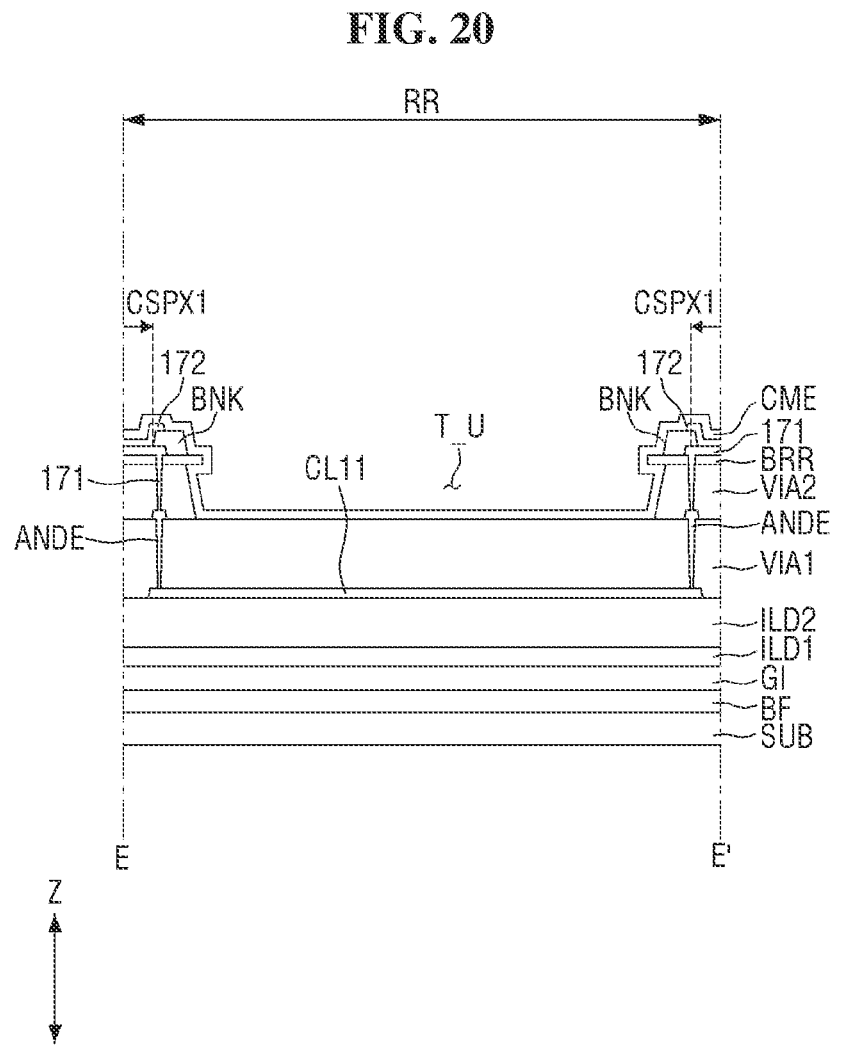

FIG. 19 is a cross-sectional view, taken along line D-D' of FIG. 13, of a display panel according to another embodiment of the present disclosure. FIG. 20 is a cross-sectional view, taken along line E-E' of FIG. 13, of the display panel of FIG. 19.

The embodiment of FIGS. 19 and 20 differs from the embodiment of FIGS. 13 is through 16 in that a plurality of connecting lines (CL1, CL2, CL3, and CL4) are disposed on a second interlayer insulating film ILD2.

Referring to FIGS. 13, 14, 19, and 20, the connecting lines (CL1, CL2, CL3, and CL4) may be disposed on the second interlayer insulating film ILD2 and may be covered by a first planarization film VIA1. Pixel connecting electrodes ANDE, which are connected to drain electrodes D or source electrodes S of first TFTs ST1, may be connected to the connecting lines (CL1, CL2, CL3, and CL4) through contact holes that penetrate the first planarization film VIA1. In this case, wire connecting electrodes CLCE may not be provided. For example, as illustrated in FIG. 19, the pixel connecting electrodes ANDE connected to the drain electrodes D of the first TFTs ST1 may be connected to a first connecting line CL1 through contact holes that penetrate the first planarization film VIA1.

In the embodiment of FIGS. 19 and 20, unlike in the embodiment of FIGS. 13 through 16, some of holes T_U may be formed to penetrate a bank BNK, barrier films BRR, and a second planarization film VIA2, but not penetrate the first planarization film VIA1, in a cross-sectional view. Holes T_U that overlap with cutout portions T_L in the third direction Z may be formed to further penetrate the first planarization film VIA1. Alternatively, in a cross-sectional view, the holes T_U may be formed to penetrate the bank BNK, the barrier films BRR, and the second planarization film VIA2, and the cutout portions T_L may be formed to further penetrate the first planarization film VIA1. The cutout portions T_L may be connected to the holes T_U to communicate with the holes T_U. In this case, in a cross-sectional view, the cutout portions T_L and the holes T_U may form holes that penetrate the display panel DP in the third direction Z.

Referring to FIG. 20, parts of the connecting lines (CL1, CL2, CL3, and CL4) that is overlap with the holes T_U in the third direction Z may be covered by the first planarization film VIA1 and may thus be electrically insulated. For example, as illustrated in FIG. 20, a (1-1)-th connecting line CL11 may be interposed between the second interlayer insulating film ILD2 and the first planarization film VIA1 and may thus be electrically insulated.

Referring to FIGS. 13 through 20, the connecting lines (CL1, CL2, CL3, and CL4) may be disposed on one layer, but the present disclosure is not limited thereto. Alternatively, the connecting lines (CL1, CL2, CL3, and CL4) may be disposed on at least two of the gate insulating film GI, a first interlayer insulating film ILD1, and the second interlayer insulating film ILD2. That is, the connecting lines (CL1, CL2, CL3, and CL4) may be provided as multilayers having two or more layers disposed on different layers. Connecting lines that are disposed on different layers may be connected through a contact hole that penetrates at least one intervening layer therebetween.

The embodiment of FIGS. 19 and 20 is almost the same as the embodiments of FIGS. 13 through 16 except that the connecting lines (CL1, CL2, CL3, and CL4) are disposed on the second interlayer insulating film ILD2, and thus, a further detailed description thereof will be omitted.

FIG. 21 is a perspective view of a display device according to another embodiment of the present disclosure. FIG. 22 is a perspective view of the display device of FIG. 21 when a display panel is not unrolled.

The embodiment of FIGS. 21 and 22 differs from the embodiment of FIGS. 1 through 8 in that a display device 1 includes a plurality of drivers RM and a plurality of bending regions RR.

Referring to FIGS. 21 and 22, the display device 1 may include a display panel DP, is a first driver RM1, and a second driver RM2.

The display panel DP may include a main region MR, a first extended region ER1, a second extended region ER2, a first boundary region BR1, a second boundary region BR2, a third boundary region BR3, and a fourth boundary region BR4.

The main region MR, the first extended region ER1, the first boundary region BR1, the second boundary region BR2, and the first driver RM1 may be almost the same as the main region MR, the extended region ER, the first boundary region BR1, the second boundary region BR2, and the driver RM, respectively, of FIGS. 1 and 2.

The display device 1 may be symmetrical with respect to an arbitrary line that passes through the middle of the display device 1 and extends in the second direction Y. Referring to FIGS. 2 and 22, the left and right parts of the display device 1 may be symmetrical to each other with respect to the arbitrary line, but the present disclosure is not limited thereto.

The second driver RM2 may provide a second rotation axis AX2, which extends in the second direction Y and is spaced apart from a first rotation axis AX1 of the first driver RM1 in the first direction X. The second driver RM2 may rotate about the second rotation axis AX2 to move the display panel DP which is wound around the second driver RM2 in a direction that intersects the first rotation axis AX1. The second driver RM2 is illustrated in FIG. 21 as having a cylindrical shape, but the shape of the second driver RM2 is not particularly limited.

The second bending region RR2 may be disposed between the main region MR and the second extended region ER2. The Third boundary region BR3 may be disposed between the second bending region RR2 and the second extended region ER2 and may connect the second bending region RR2 and the second extended region ER2, and the fourth boundary region BR4 may be disposed between the second bending region RR2 and the main region MR and may is connect the second bending region RR2 and the main region MR.

Part of the second bending region RR2 may be bent to surround the second rotation axis AX2. For example, part of the second bending region RR2 may be wound around the second rotation axis AX2 which has a round outer circumferential surface, but the present disclosure is not limited thereto. The part of the second bending region RR2 that is wound around the second rotation axis AX2 may display an image in the first direction X, for example, in a rightward direction. The first direction X may also be referred to as a lateral direction. When the display panel DP is not unrolled, another part of the second bending region RR2 may display an image in a downward direction.

In the second bending region RR2, like in the first bending region RR1, a plurality of copy pixels CPX may be disposed. The second bending region RR2 may have a lower resolution than the main region MR, the second extended region ER2, the third boundary region BR3, or the fourth boundary region BR4, but the present disclosure is not limited thereto.

The second extended region ER2 may be connected to the second bending region RR2. The second extended region ER2 may be disposed to be parallel to the main region MR with the second driver RM2 interposed therebetween. The second extended region ER2 may display an image in a direction opposite to the direction in which the main region MR displays an image, for example, in the downward direction.

The third boundary region BR3 may be disposed between the second bending region RR2 and the second extended region ER2. The third boundary region BR3 may connect the second bending region RR2 and the second extended region ER2. The third boundary region BR3 may display an image in the direction opposite to the direction in which the main region MR displays an image, for example, in the downward direction.

The fourth boundary region BR4 may be disposed between the main region MR and the second bending region RR2. The fourth boundary region BR4 may connect the main region MR and the second bending region RR2. The fourth boundary region BR4 may display an image in the third direction Z, for example, in an upward direction.

Referring to FIGS. 21 and 22, in a case where the first driver RM1 rotates in a first rotation direction and the second driver RM2 rotates in a second rotation direction, parts of the first and second bending regions RR1 and RR2 that are wound around the first and second rotation axes AC1 and AX2 when the first and second drivers RM1 and RM2 are not rotated may be unwound from the first and second rotation axes AC1 and AX2. As a result, the size of the display panel DP being exposed in the upward direction may increase, and the size of the display panel DP being exposed in the downward direction may decrease. For example, referring to FIGS. 21 and 22, the first and second rotation directions may be clockwise and counterclockwise directions, respectively, but the present disclosure is not limited thereto.

On the contrary, in a case where the first driver RM1 rotates in the second rotation direction and the second driver RM2 rotates in the first rotation direction, parts of the first and second bending regions RR1 and RR2 may be wound back around the first and second rotation axes AC1 and AX2. As a result, the size of the display panel DP being exposed in the upward direction may decrease, and the size of the display panel DP being exposed in the downward direction may increase.

Referring to FIGS. 21 and 22, the third and fourth boundary regions BR3 and BR4 may extend parallel to the first and second directions X and Y. At least part of the third or fourth boundary region BR3 or BR4 may be bent over the second driver RM2.

The second bending region RR2, the second extended region ER2, the third boundary region BR3, and the fourth boundary region BR4 may be almost the same as the first bending region RR1, the first extended region ER1, the first boundary region BR1, and the second boundary region BR2, respectively.

In the main region MR, the second extended region ER2, the second bending region RR2, the third boundary region BR3, and the fourth boundary region BR4, a plurality of pixels PX, a plurality of copy pixels CPX, and a plurality of connecting lines (CL1, CL2, CL3, and CL4) may be disposed in almost the same manner as in the embodiment of FIGS. 4 through 8, and almost the same voltages may be applied to pixel electrodes 171 of copy pixels CPX in the second bending region RR2 and pixel electrodes 171 of pixels PX by the connecting lines (CL1, CL2, CL3, and CL4).

Also, cutout portions T_L may be disposed between the copy pixels CPX in the second bending region RR2 in almost the same manner as in the embodiments of FIGS. 6, 9, 12, and 13 through 15. Thus, stress applied to the second bending region RR2 can be reduced, and the flexibility of the display panel DP can be improved.

In the second bending region RR2, like in the first bending region RR1, driving circuits including TFTs may not be disposed. Thus, the copy pixels CPX in the second bending region RR2 may be driven by driving circuits in the third or fourth boundary region BR3 or BR4.

The embodiment of FIGS. 21 and 22 is almost the same as the embodiment of FIGS. 1 through 8 except that the display device 1 includes a plurality of drivers RM and a plurality of bending regions RR1 and RR2, and thus, a further detailed description thereof will be omitted.

The current disclosure should not be construed as being limited to the embodiments set forth herein. Rather, these embodiments are provided so that this disclosure will be thorough and complete and will fully convey the concept of the inventive concept to those is skilled in the art.

While the current disclosure have been particularly shown and described with reference to some embodiments thereof, it will be understood by one of ordinary skill in the art that various changes in form and detail may be made therein without departing from the spirit and scope of the current disclosure as defined by the following claims.

What is claimed is:

1. A display device comprising:
a display panel including a bending region including a bent portion and a bendable portion, a boundary region which is connected to the bending region, and a plurality of connecting lines disposed in the bending region and the boundary region,
wherein the boundary region includes a plurality of pixels and a plurality of driving circuits for driving the plurality of pixels,
wherein the bending region includes a plurality of copy pixels which are driven by the plurality of driving circuits in the boundary region, and
wherein a pixel among the plurality of pixels in the boundary region and a copy pixel among the plurality of copy pixels in the bending region are directly connected to a same driving circuit disposed in the boundary region through one of the plurality of connecting lines and receive a same anode voltage from the same driving circuit.

2. The display device of claim 1, wherein
one connecting line of the plurality of connecting lines connects the pixel among the plurality of pixels and the copy pixel among the plurality of copy pixels.

3. The display device of claim 1, wherein the boundary region includes a first boundary region which is connected to one side of the bending region and a second boundary region which is connected to the other side of the bending region, and
wherein the display panel further includes a main region which is connected to the second boundary region and an extended region which is connected to the first boundary region and overlaps with the main region in a plan view.

4. The display device of claim 1, wherein the bending region includes a first bending region and a second bending region which is spaced apart from the first bending region.

5. An electronic device comprising:
a display panel including a bending region including a bent portion and a bendable portion, and a boundary region which is connected to the bending region;
a plurality of connecting lines disposed in the bending region and the boundary region, one connecting line of the plurality of connecting lines connecting one pixel among a plurality of pixels and one copy pixel among a plurality of copy pixels,
wherein the boundary region includes the plurality of pixels and a plurality of driving circuits for driving the plurality of pixels,
wherein the bending region includes the plurality of copy pixels which are driven by the plurality of driving circuits in the boundary region, and
wherein the display panel further includes a substrate, one or more inorganic films which are disposed on the substrate, and a plurality of cutout portions which are disposed in the bending region, the plurality of cutout portions being regions in which the one or more inorganic films are removed.

6. The display device of claim 5, wherein a cutout portion of the plurality of cutout portions is disposed between the plurality of copy pixels in a plan view.

7. The display device of claim 6, wherein the cutout portion of the plurality of cutout portions completely penetrate the display panel, and
wherein the plurality of connecting lines are disposed to bypass the cutout portion in a plan view.

8. The display device of claim 7, wherein the display panel further includes a plurality of holes which are disposed between the copy pixels in a plan view and one hole of the plurality of holes is connected to one of the plurality of cutout portions and penetrates the display panel.

9. The electronic device of claim 5, wherein the one or more inorganic films include a gate insulating film which is disposed on the substrate, a first interlayer insulating film which is disposed on the gate insulating film, and a second interlayer insulating film which is disposed on the first interlayer insulating film, and
wherein the plurality of cutout portions penetrate the second interlayer insulating film.

10. The electronic device of claim 9, wherein the plurality of connecting lines are disposed on the first interlayer insulating film.

11. The electronic device of claim 9, wherein the plurality of connecting lines are disposed on the gate insulating film.

12. The electronic device of claim 9, wherein the plurality of connecting lines are disposed on the second interlayer insulating film.

13. The electronic device of claim 9, wherein the plurality of cutout portions further penetrate the first interlayer insulating film.

14. The electronic device of claim 9, wherein the plurality of pixels and the plurality of copy pixels include a plurality of pixel electrodes, and
wherein the plurality of connecting lines electrically connect the plurality of pixel electrodes of the plurality of pixels and the plurality of pixel electrodes of the plurality of copy pixels.

15. The electronic device of claim 14, wherein one driving circuit of the plurality of driving circuits includes a thin-film transistor,
wherein the thin-film transistor includes an active layer, a gate electrode which is disposed on the active layer, a source electrode which is disposed on the gate electrode, and a drain electrode which is disposed on the gate electrode, and
wherein the connecting line is connected to the drain electrode.

16. The electronic device of claim 9, wherein a portion of the connecting line overlaps with a cutout portion of the plurality of cutout portions in a plan view, and wherein the display panel further includes a first planarization film which is disposed on the second interlayer insulating film and a second planarization film which is disposed on the first planarization film.

17. The electronic device of claim 16, wherein the portion of connecting line overlapped with the cutout portion is covered by one of the first planarization film and the second planarization film.

18. A display device comprising:

a display panel including a main region, an extended region which overlaps with the main region in a plan view, a bending region which is disposed between the main region and the extended region, a first boundary region which is disposed between the bending region and the extended region, a second boundary region which is disposed between the bending region and the main region, and a plurality of connecting lines disposed in the bending region and the first boundary region, wherein each of the first boundary region and the second boundary region includes a plurality of pixels and a plurality of driving circuits for driving the plurality of pixels, wherein the bending region includes a plurality of copy pixels which are connected to either the plurality of driving circuits in the first boundary region or the plurality of driving circuits in the second boundary region, and wherein a pixel among the plurality of pixels in the first boundary region and a copy pixel among the plurality of copy pixels in the bending region are directly connected to a same driving circuit disposed in the first boundary region through one of the plurality of connecting lines and receive a same anode voltage from the same driving circuit.

19. The display device of claim 18, wherein the plurality of connecting lines connect the plurality of pixels and the plurality of copy pixels.

20. The display device of claim 18, wherein the display panel further includes a substrate, one or more inorganic films which are disposed on the substrate, and a plurality of cutout portions which are disposed in the bending region and penetrate the one or more inorganic films.

* * * * *